United States Patent
Cheng et al.

(10) Patent No.: US 6,415,420 B1
(45) Date of Patent: Jul. 2, 2002

(54) SYNTHESIZING SEQUENTIAL DEVICES FROM HARDWARE DESCRIPTION LANGUAGES (HDLS)

(75) Inventors: Szu-Tsung Cheng, Campbell; Ihao Chen, San Jose; Xuequn Xiang, Foster City, all of CA (US)

(73) Assignee: Incentia Design Systems, Inc., Santa Clara, CA (US)

( * ) Notice: Subject to any disclaimer, the term of this patent is extended or adjusted under 35 U.S.C. 154(b) by 0 days.

(21) Appl. No.: 09/354,933

(22) Filed: Jul. 15, 1999

Related U.S. Application Data
(60) Provisional application No. 60/131,729, filed on Apr. 30, 1999.

(51) Int. Cl.[7] .............................................. G06F 17/50
(52) U.S. Cl. .............................................. 716/4; 716/5
(58) Field of Search ...................... 716/4, 5, 6

(56) References Cited

U.S. PATENT DOCUMENTS

| | | | |
|---|---|---|---|
| 5,530,841 A | 6/1996 | Gregory et al. ................ | 716/3 |
| 5,581,781 A | 12/1996 | Gregory et al. ................ | 716/18 |
| 5,748,488 A | 5/1998 | Gregory et al. ............. | 364/490 |
| 5,774,370 A | * 6/1998 | Giomi ........................... | 716/4 |
| 6,077,305 A | 6/2000 | Cheng et al. ................. | 703/16 |
| 6,216,252 B1 | * 4/2001 | Dangelo et al. ............... | 716/1 |

OTHER PUBLICATIONS

Eustace et al., "A Deterministic Finite Automation Approach to Design Rule Checking for VLSI", ACM IEEE Design Automation Conference, Las Vegas, Jun. 14–16, 1982, pp. 712–717.

Szu–Tsung Cheng et al., "Compiling Verilog into Automata", Memorandum UCB/ERL M94/37, UCB, 1994, pp. 51.

Szu–Tsung Cheng et al., "Compiling Verilog into Timed Finite State Machines", (1995) IEEE, International Verilog Conference, pp. 32–39.

Gajski et al., "High–Level Synthesis, Introduction to Chip and System Design", Kluwer Academic Publishers, (1992), Tsing Hua University, pp. 138–175.

Walker, "A Survey of High–Level Synthesis Systems", in Research Report No. CMUCAD 89–35, Jun. 1989, 13 pgs.

* cited by examiner

*Primary Examiner*—Vuthe Siek
(74) *Attorney, Agent, or Firm*—Morrison & Foerster LLP

(57) ABSTRACT

A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising producing a graph structure in the storage medium by providing a path origination node in the storage medium; providing a path destination node in the storage medium; producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure; associating respective complete paths with a respective control statements associated in the CDFG with corresponding branches that have been concatenated with other corresponding branches to produce such respective complete paths; and traversing respective complete paths of the graph information structure to determine whether there is a respective path that is not associated with a respective control statement.

9 Claims, 17 Drawing Sheets

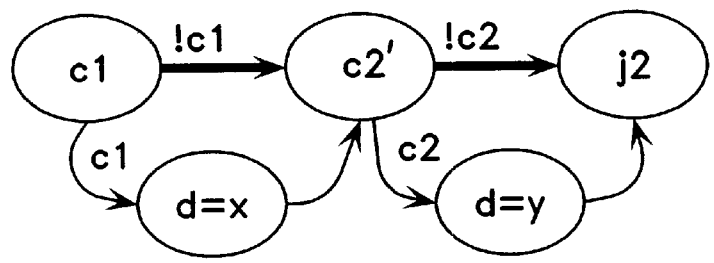
Fig. 4C1
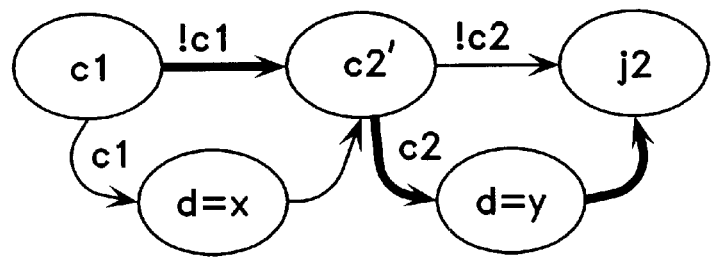
Fig. 4C2
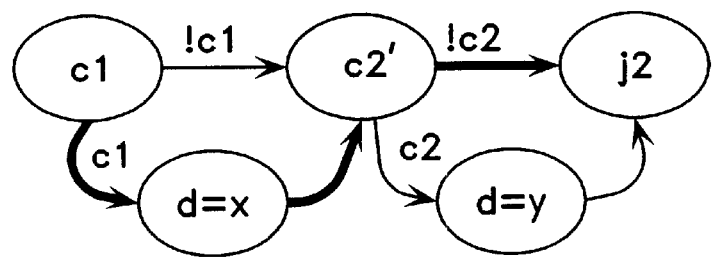
Fig. 4C3
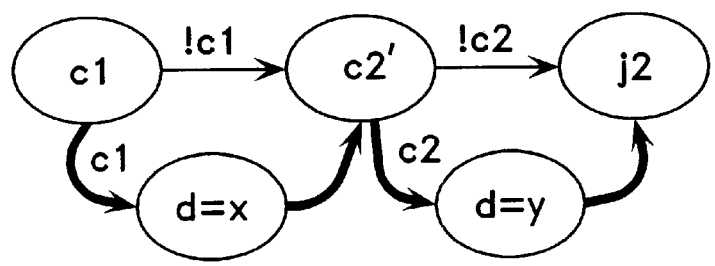
Fig. 4C4

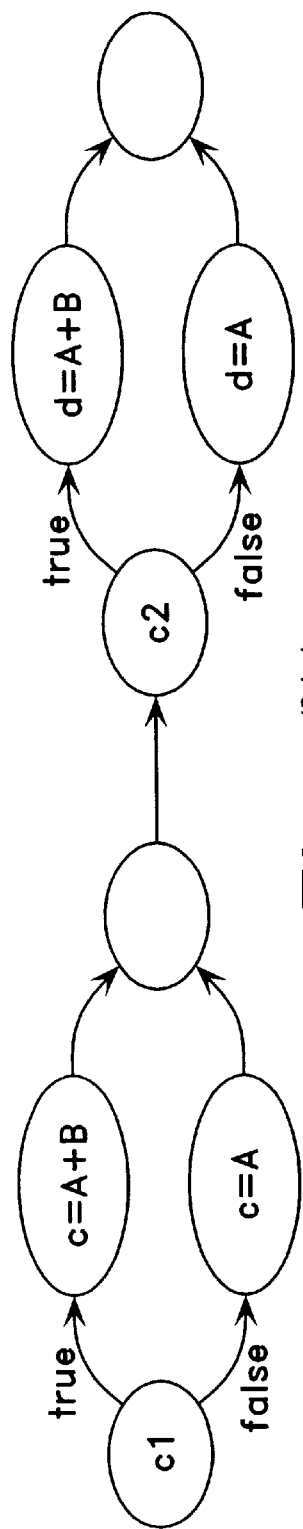
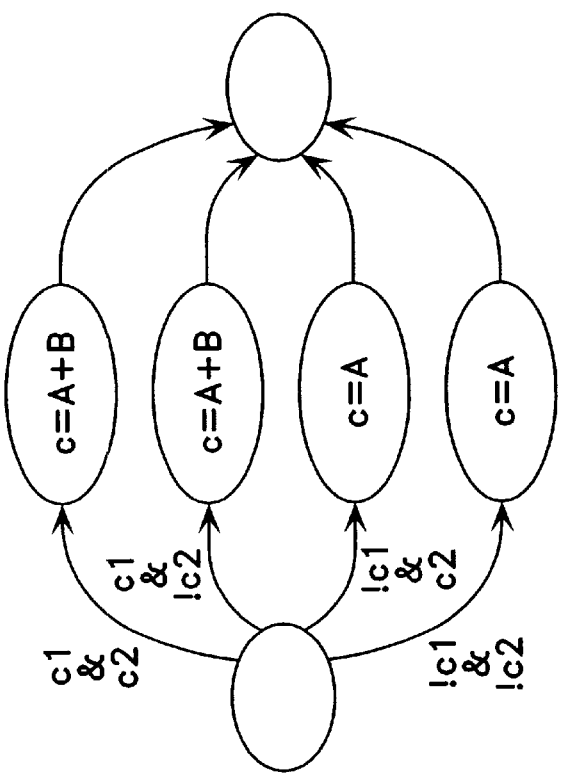
Fig. 7A
Projection/Fusion w.r.t. c:
Fig. 7B

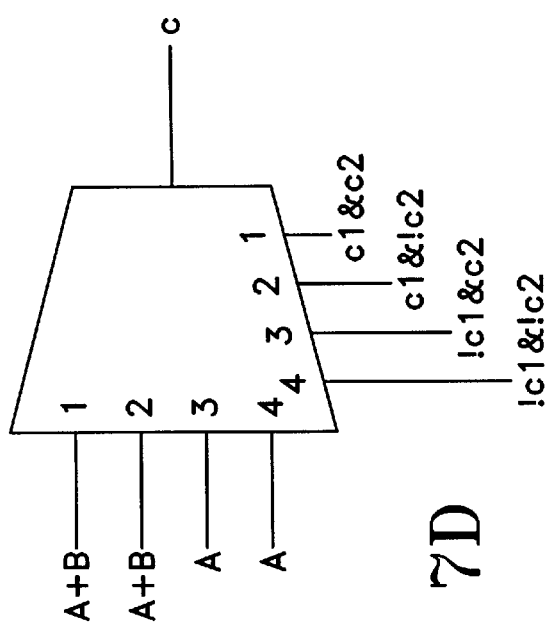
Fig. 7C
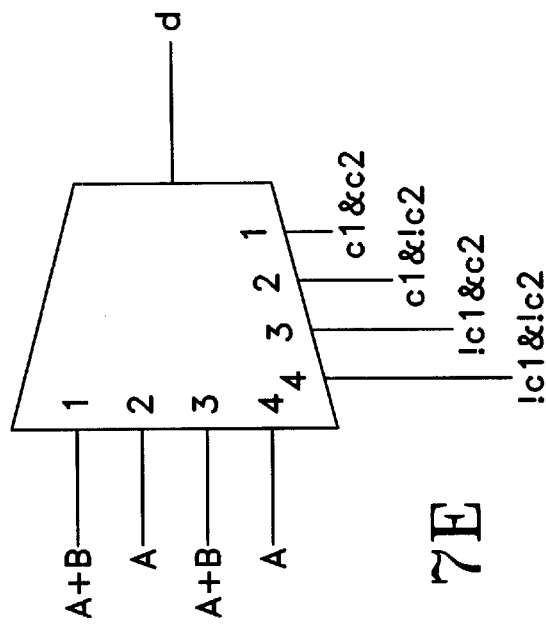
Fig. 7D
Fig. 7E
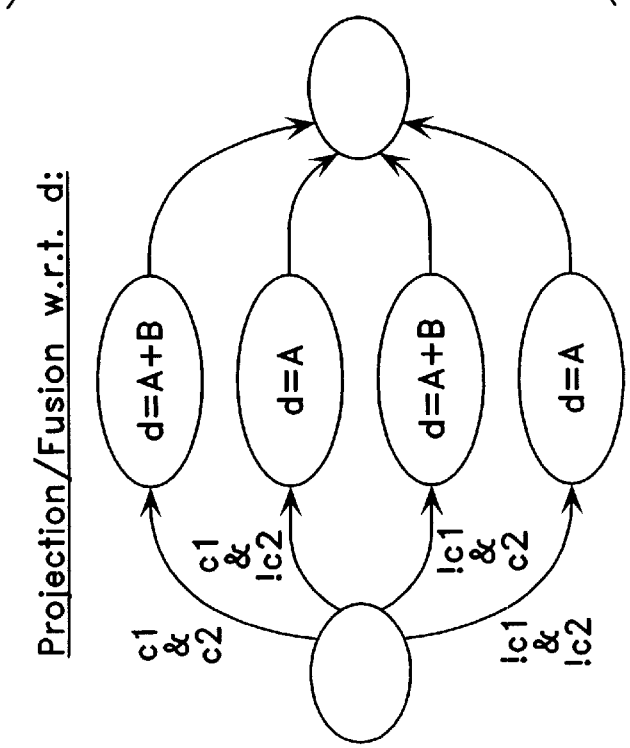

CDFG with faked x=x assignment:

Projected/fused graph:

CDFG with faked x=x assignment:

Projected/fused graph:

Before projection/fusion:

After projection/fusion:

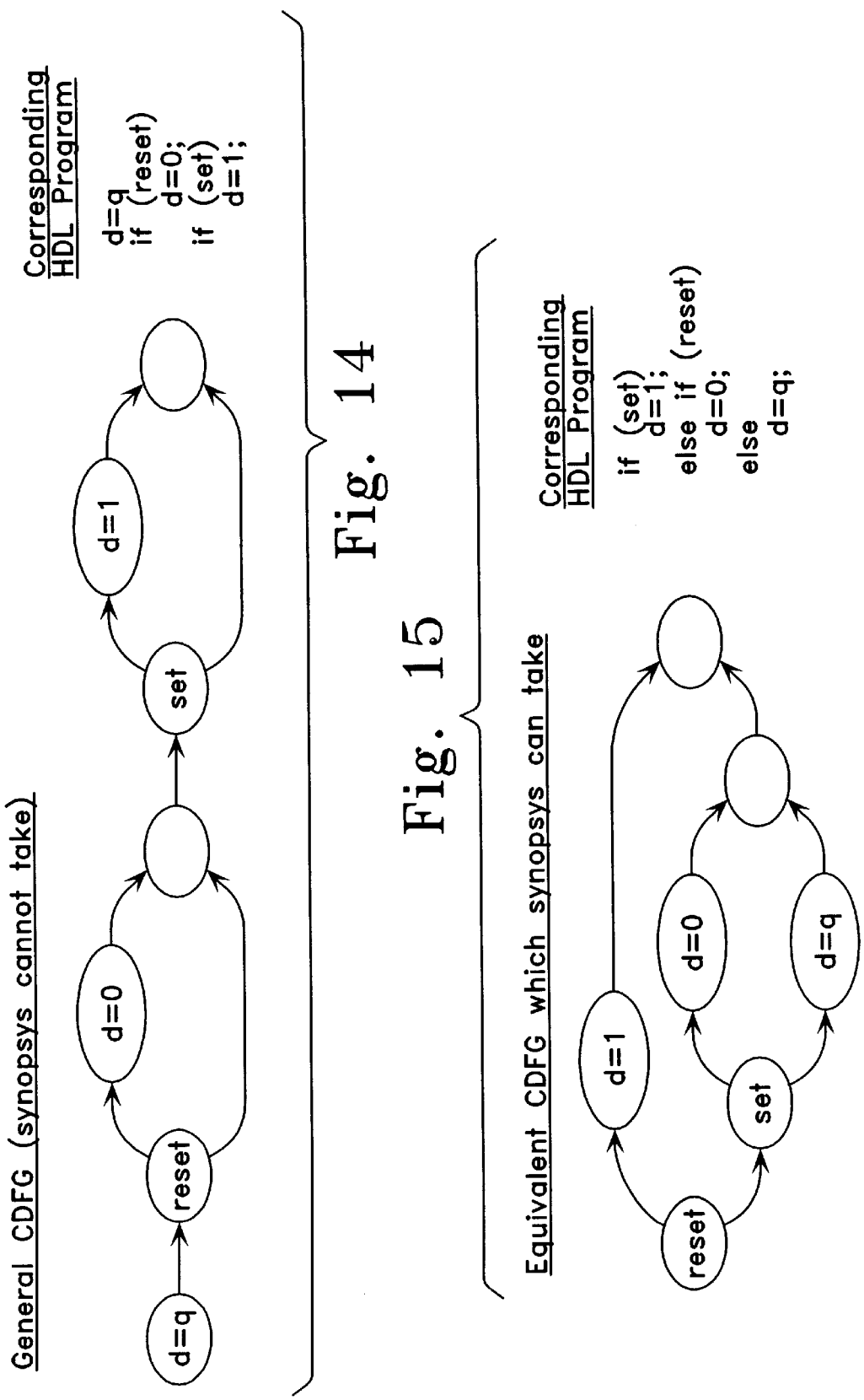

SYNTHESIZING SEQUENTIAL DEVICES FROM HARDWARE DESCRIPTION LANGUAGES (HDLS)

CROSS-REFERENCE TO RELATED APPLICATIONS

This application claims priority to provisional application No. 60/131,729, filed on Apr. 30, 1999.

BACKGROUND OF THE INVENTION

1. Field of the Invention

The invention relates generally to the design of hardware electronic circuits using hardware design language (HDL) descriptions of circuit behavior, and more specifically, to the extraction of hardware circuit components from control data flow graph (CDFG) structure produced from HDL descriptions to hardware circuit behavior.

2. Description of the Related Art

Simulation has made it possible to design electronic circuits and systems in terms of system behavior. Simulation at various levels (physical, RTL, behavioral, etc.) has made it possible for many designers to try out various circuit design possibilities and prototypes without actually fabricating designs. It also has aided designers in identifying various bugs before the circuit is manufactured. Simulation also has made it easier to develop and test a partial circuit or system design since one need not develop an implementation of the whole design before it can be simulated. In addition, behavioral descriptions of circuits or systems can make it easier to simulate abstractions of designs/environments.

Hardware Design Languages (HDLs), enable hardware designers to design hardware circuits in essentially the same manner in which they write software programs. Many existing hardware designs have been written in HDLs like Verilog 2 and VHDL, for example. The *IEEE Standard VHDL Language Reference Manual*, Institute of Electrical and Electronics Engineers, 1988 explains the VHDL language and its origin. Donald E. Thomas and Philip R. Moorby, *The Verilog Hardware Description Language*, Kluwer Academic Publishers, Nowell, Mass., 1991 describe the Verilog language.

Basically, HDL descriptions do not describe circuit or system components directly. Instead, they describe the behavior of components. These HDLs are in essence programming languages used to describe massively parallel computations (systems of parallel sequential processes). They are designed for simulation, and their semantics are defined in terms of simulation results. To automate the design process as fully as possible and ensure design consistency, it is desirable to extract circuits directly from these HDL programs. The term extract as used herein includes automated processes that run on a computer system and translate a HDL description of circuit behavior into a hardware circuit that exhibits the described behavior. A circuit may be extracted, for instance, through algorithmic processes that map portions of a hardware description to corresponding portions of a hardware circuit. Unfortunately, the complex process of circuit extraction may be further complicated from time to time, for example, by the possibility of mismatches between the underlying models for HDLs and the actual hardware circuits.

Theoretically and most intuitively, to extract circuits from a system of parallel sequential processes specified using an HDL, one may conduct exhaustive simulation and map the simulation traces directly into circuit components. Due to the enormous number of possible inputs to a complex system, however, such an exhaustive simulation approach often is likely to require so much computation and so much time as to be impractical.

In general, there can be a substantial variation between the semantic models of input HDLs and the synthesized target hardware architectures. A canonical intermediate representation of a HDL behavioral description often is employed to preserve the original behavior of the input HDL specification, while allowing the addition of synthesis results through various bindings, optimizations and mappings. A flow graph is a well known type of intermediate information structure that can represent the flow of control and/or data in a HDL behavioral description.

A control data flow graph (CDFG) is one example of a type of flow graph that can serve as an intermediate representation of the interaction between the control path and data path of processes of a HDL behavioral description. A control-flow portion of a CDFG captures sequencing, conditional branching and looping constructs in a behavioral description, while the data-flow graph portion captures operational activity typically described by assignment statements of a HDL description. The use of CDFGs in high-level synthesis of hardware circuits is well known. See, Robert A. Walker, "A Survey of High-Level Synthesis Systems", in Research Report No. CMUCAD8935, SRCCMU Research Center for Computer-Aided Design, Carnegie Mellon University, Pittsburgh, Pa. 152133890, June 1989, for a discussion of the use of CDFGs in high-level synthesis.

The construction of a flow graph or more specifically, a CDFG, from a source program can be achieved, for example, by traversing a parse-tree of a source program. Consider the following sample Verilog fragment,

```
if (c1)
    d=x;
if (c2)
    d=y;
```

The CDFG of FIG. 1 can be produced by parsing the above Verilog fragment. It will be appreciated that Verilog is just one example of a HDL. A thorough explanation of the construction of a flow graph from a source program is provided, for example, in Alfred V. Aho, Ravi Sethi, and Jeffrey D Ullma, Compilers: Principles, Techniques, and Tools, Addison-Wesley, 1985, and in Charles N. Fischer Jr. and Richard J. Le Blanc, Crafting a Compiler, The Benjamin/Cumings Publishing Company, Menlo Park, Calif., 1988.

U.S. Pat. No. 5,530,841 and U.S. Pat. No. 5,581,781, both issued to Gregory et al., describe earlier techniques to extract sequential circuits by using HDLs to produce control flow graphs (CFGs) and by then matching the CFGs to hardware circuits. A sequential circuit is a circuit whose outputs are functions of its inputs as well as its current state. A sequential circuit typically includes a sequential state storage device such as a flip-flop or a latch, for example. Basically, the sequential circuit extraction process disclosed by Gregory et al. involved an analysis of a CFG to determine what hardware circuit to extract from a portion of the CFG.

Szu-Tsung Cheng, Robert K. Brayton, Gary York, Katherine Yelick, and Alexander Saldanha, "Compiling Verilog into Timed Finite State Machines", International Verilog Conference, 1995, and Szu-Tsung Cheng and Robert K. Brayton, "Compiling Verilog into Automata", Memorandum UCB/ERL M94/37, University of California at Berkeley, 1994, describe an earlier alternative approach to modeling a wide range of HDL programs. Basically, this alternative approach attempts to use two primitive logic devices, edge-detector and resolution logic, to synchronize different processes described using a HDL. An advantage of this earlier alternative approach is that it can model a very large subset of processes described using a HDL. It can even model processes that do not have actual hardware implementations. A weakness of this earlier alternative approach is that its primitive logic devices often do not afford easy hardware mapping.

While earlier techniques for extracting sequential circuits from HDL behavioral descriptions generally have been successful, there have been some shortcomings. Style guides have been developed in order to facilitate the extraction of hardware circuit information from HDL descriptions. A style guide instructs the creator of the HDL description as to the manner or "style" in which HDL descriptions are to be written in order to ensure accurate extraction of circuit information. Thus, style guides may serve to limit the manner in which HDL descriptions may be expressed so as to ensure accurate interpretation of an HDL description. "Synopsys HDL Coding Style: Synthesis", by Snyopsys, 1998 is one example of such a style guide.

Thus, there has been a need for improvement in the extraction of state storage devices from HDL behavioral descriptions. More specifically, there has been a need for improvement in the use of control flow data graphs (CDFGs) to extract sequential hardware devices from HDL statements. Furthermore, there has been a need for more flexibility in the styles that can be employed to create HDL descriptions. The present invention meets these needs.

SUMMARY OF THE INVENTION

In one aspect, the present invention may improve upon the ability to more accurately identify the need for latch, flip-flop and combinational logic circuits based upon a control data flow graph (CDFG) representation of a HDL description.

In another aspect, the present invention may provide wider latitude in the range of HDL styles that can be translated accurately into hardware circuits through the use of CDFGs.

In one aspect, the present invention provides a graph structure in a computer readable storage medium, produced from a CDFG representing an HDL description. The graph structure includes a path origination node and a path destination node and respective complete paths between the path origination node and the path destination node. Each respective complete path is associated with respective control statements.

In another aspect of the invention, respective complete paths of the graph information are traversed to determine whether there is a respective path that is not associated with a respective control statement.

BRIEF DESCRIPTION OF THE DRAWINGS

FIG. 4 is an example of a subgraph CDFG that results from a projection of the CDFG of FIG. 1 with respect to variable x in accordance with a presently preferred embodiment of the invention.

FIGS. 4A–4F illustrate a graph fusion process applied to the graph of FIG. 1 in accordance with a presently preferred embodiment of the invention.

FIGS. 4C1–4C4 illustrate all possible complete flow paths through the graph of FIG. 4B.

FIG. 7A shows an illustrative graph;

FIG. 7B shows an illustrative fused subgraph produced when projection and fusion processes are applied to the graph of FIG. 7A with respect to variable c;

FIG. 7C shows an illustrative fused subgraph produced when projection and fusion processes are applied to the graph of FIG. 7A with respect to variable d;

FIG. 7D shows n illustrative circuit that can be extracted from the fused graph of FIG. 7B; and FIG. 7E shows an illustrative circuit that can be extracted from the fused graph of FIG. 7C.

FIG. 14 is an illustrative example of a CDFG produced from a sixth HDL description.

FIG. 15 is an illustrative example of a CDFG produced from a seventh HDL description.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Moreover, in the following description, numerous details are set forth for purpose of explanation. However, one of ordinary skill in the art would realize that the invention may be practiced without the use of these specific details. In other instances, well-known structures and devices are shown in block diagram form in order not to obscure the description of the invention with unnecessary detail. Thus, the present invention is not intended to be limited to the embodiment shown, but is to be accorded the widest scope consistent with the principles and features disclosed herein.

Terminology

The following paragraphs set forth some terminology that shall be used herein to refer to graph operations described in more detail below.

A CDFG is a type of an information structure that may be stored in a computer readable medium.

Figure 1:
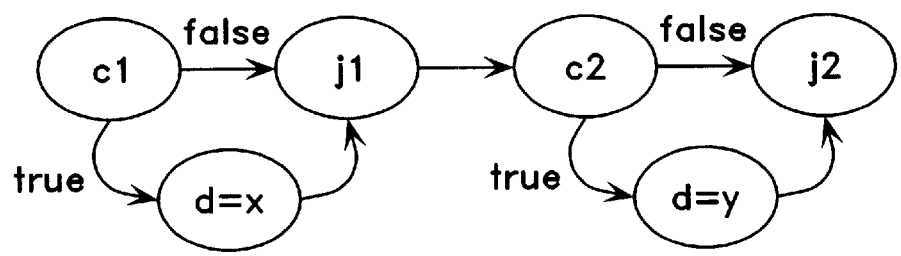
FIG. 1 is an example of a control data flow diagram (CDFG) generated from a HDL description.

In general, a different CDFG may be allocated for each different sequential process of a HDL behavioral description. In FIG. 1, a first control structure includes branch node c1 and join node j1. A second control structure includes branch node c2 and join node j2. A first control statement directs the assignment of value x to variable d as represented by data reference node d=x within the first control construct. A second control statement directs the assignment of value y to variable d as represented by data reference node d=y within the second control construct.

Assuming, for example, that G is the graph depicted in FIG. 1 and $G=(V_d+V_c, E)$, then $V_d$ is the set of vertices for dataoperations/datapaths, and $V_c$ is the set of vertices for flow control constructs. Each node in $V_c$ is called a control node. More specifically, for each control statement in a source HDL program, a control structure is allocated to represent the statement. In this example, each control structure includes two control nodes, a branch control node and a join control node. For certain applications or algorithms, the branch control node denotes the beginning of a control construct, and a join control node denotes the end of a control construct. It will be appreciated that, although in this specification, a pair of control nodes is shown for each control structure, although a control statement in an HDL statement may be represented by a single control node that represents both the branch and join operations in a CDFG. In this specification, the term node is used interchangeably with the term vertex.

Continuing with the example graph G of FIG. 1, E is a set of edges or arcs. The symbol e can be used to represent a conditional arc in the example (CDFG) G. In general, a conditional arc, $e=(v_1, v_2) \in E$ iff $v_1, v_2 \in V_d \cup V_c$, $v_1$ occurs before $v_2$ for at least one execution of a program represented by a graph that includes e, and there is no intervening statement between $v_1$ and $v_2$. An arc originating from a conditional node (or from one of a pair of conditional nodes) shall be referred to as a conditional arc/edge. Conditional edges typically are labeled with a logical formula that denotes the condition under which the branch is taken. For example, a general statement of the formula is denoted by L(e) where e is a conditional arc.

Graph Projection

In one aspect of a present embodiment of the invention, there is an attempt to simplify the process of evaluating a need for a sequential state element, such as a latch or a flip-flop for example, in a hardware design extracted from a given HDL behavioral description by identifying portions of a CDFG corresponding to the HDL description in which the state of a selected variable might change. Basically, an HDL description may include reference to multiple different variables. The need for a sequential state element for any given variable can be evaluated for that given variable independently of the need for a sequential state element for any other variable. In order to facilitate this independent evaluation of the requirement for a sequential state element for any given selected variable, portions of the CDFG that are not relevant to the evaluation for the selected variable are identified. Only these identified portions of the CDFG are considered in a subsequent process to assess the need for a sequential state element with respect to the selected variable.

More particularly, in one embodiment of the invention, a subgraph is produced that includes only those portions of the CDFG that are relevant to the evaluation of the need for a sequential state element for a selected variable. This simplification process can be repeated for each variable as the different variables are designated as the selected variable. This simplification process is referred to herein as graph projection. In essence, for each selected variable, there is an attempt to prune out portions of the CDFG that are irrelevant to the evaluation of the need for a sequential state element for such selected variable. This pruning simplifies subsequent graph operations used to ascertain the need for a sequential state element for the selected variable.

Specifically, in order to simplify the evaluation of the need for a sequential state element for a given selected variable v in accordance with a present embodiment of the invention, the flow graph $G=(Vd+Vc, E)$ is projected with respect to that selected variable by performing the following process:

1. For each data vertex in Vd, if v is not referenced (read or write), then remove that vertex. Replace the removed node with a single arc.
2. For each control vertex in Vc, if it denotes the beginning of the control construct and all arcs originating from it directly reach a corresponding end node, then remove the control vertex and associated arcs. Replace the removed arcs/vertices with a single arc.
3. Repeat steps 1 and 2 until no further reduction can be made.

For example, if the flow graph in FIG. 1 is projected with respect to selected variable d, then the subgraph that result is shown FIG. 1. There are no changes to the original CDFG in FIG. 1 since each of the data vertices Vd references the selected variable d (d=x,d=y) and since neither of the control vertices Vc (c1,c2) that denote the beginning of a control construct has all arcs directly reaching a corresponding end node.

Figure 2:
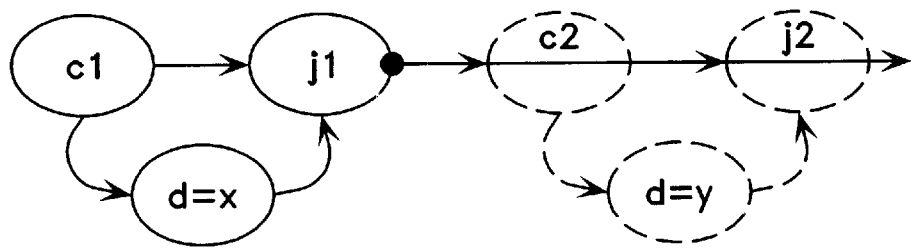
FIG. 2 is an example of a subgraph CDFG that results from a projection of the CDFG of FIG. 1 with respect to variable d in accordance with a presently preferred embodiment of the invention.

As another example of the projection process, if the flow graph in FIG. 1 is projected with respect to selected variable x, then the subgraph that result is shown FIG. 2. The dotted lines in FIG. 2 indicate the removed components of the graph of FIG. 1. According to step 1 (1) of the graph project process, the data vertex (d=y) that does not reference selected variable x is removed and is replaced with an arc (not shown). As a result, all arcs originating from control vertex c2 directly reach the end node corresponding to c2. Consequently, according to step two (2) of the graph projection process, c2 is replaced by the single arc originating from the end node corresponding to control vertex c1.

Figure 3:
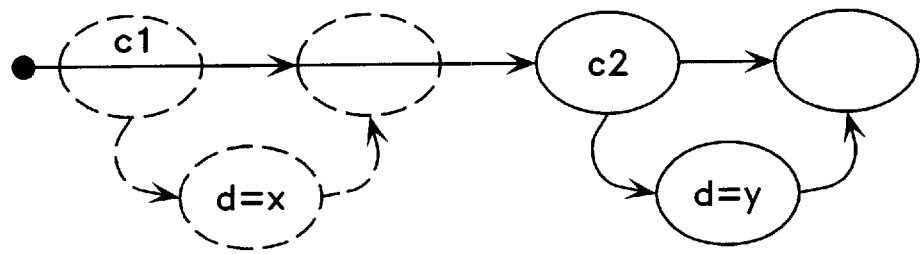
FIG. 3 is an example of a subgraph CDFG that results from a projection of the CDFG of FIG. 1 with respect to variable x in accordance with a presently preferred embodiment of the invention.

As another example of the projection process, if the flow graph in FIG. 1 is projected with respect to selected variable y, then the subgraph that result is shown FIG. 3. The dotted lines in FIG. 3 indicate the removed components of the graph of FIG. 1. According to step one (1) of the graph projection process, the data vertex (d=x) that does not reference selected variable y is removed and is replaced with an arc (not shown). As a result, all arcs originating from control vertex c1 directly reach the end node corresponding to c1. Consequently, according to step two (2) of the graph projection process, c1 is replaced by the single arc terminating at control vertex c2.

Graph Fusion

In accordance with one aspect of the invention, an evaluation is made as to whether there is a combination of branches through a flow graph for a given selected variable that can afford traversal of the graph without a change in the value of the variable so that the variable has the same value at the end of the graph traversal that it had at the beginning of the graph traversal. It will be appreciated that a graph as referred to in this section is a CDFG. Moreover a graph as referred to in this section may be some subgraph portion of a larger CDFG.

More specifically, every possible complete execution flow or complete path (a path from end to end) through the graph is identified. Paths can be identified by concatenating (combining end-to-end) branches of a graph. In a preferred embodiment, control branches from successive adjacent control structures are concatenated to produce paths. An objective in identifying paths is to identify all possible combinations of branches that data might follow in traversing the graph. There is a different path for each different combination of branches.

For example, for a graph with a first and a second control structure, each possible control branch originating from the first control structure is concatenated with every possible control branch of the second control structure of the graph. Each such concatenation results in a segment of a different possible complete path. Assuming such graph has three control structures, then each complete path segment is further concatenated with every possible control branch of the third control structure. Each such further concatenation results in even more possible complete paths. This process is performed for each control branch of every control structure in the graph until all possible complete paths have been fully identified.

In this manner, a plurality of paths may be identified. Another objective in the identifying paths is to determine whether there is a path through the graph that a datum might follow in which the datum is unchanged from start to finish. Control statements operate on data that traverse the path. Thus, a control statement associated with a path may cause change in data values as the data traverses the path.

As all possible complete paths are identified, control statements are identified that are associated with the branches used to identify such complete paths. This association is maintained between identified paths and the control statements along the various branches concatenated to product the path. For instance, a given complete path might involve the concatenation of several branches, and each such branch might be associated in electronic memory with a different control statement. In that situation, for example, such given complete path would be associated with one or more control statements of the branches concatenated to produce that complete path.

A given variable can traverse a given complete path unchanged only if there is no control statement associated with such given complete path that could result in a change in the value of such variable.

If there is a complete path that the variable could traverse unchanged, then a determination can be made that a sequential state storage element is required. Otherwise, a determination can be made that a sequential state storage element is not required.

More specifically, for each identified complete path, a determination is made as to whether there is a control statement by which a given selected variable is referenced (read or write). If it is determined that, for a given complete path, there are one or more references to the selected variable that could result in a change in the value of the variable on such a complete path, then it may be concluded that the selected variable could not traverse that particular complete path unchanged. If on the other hand, it is determined that there exists a complete path through the graph for which there is no control statement that makes a reference to the selected variable that could change the variable, then it may be concluded that the selected variable could traverse that particular complete path unchanged.

In one embodiment of the invention, the overall technique for evaluating whether there is a complete path through a flow graph for a given selected variable involves a process referred to herein as graph fusion. As described above, graph fusion involves the formation of a subgraph, stored in a computer readable medium, referred to herein as a fused graph consisting of product arcs and associated references to variables. A fused graph can be used to determine whether a selected variable can traverse the subgraph unchanged. A determination that the selected variable cannot traverse the fused graph unchanged signifies that a sequential storage element is not required for the original graph used to produce the fused graph. A determination that the selected variable can traverse the fused graph unchanged signifies that a sequential storage element is required for the original graph used to produce the fused graph.

The graph fusion process in accordance with the invention is implemented using computer program code stored in computer readable medium. The code may be encompassed as part of a larger program of a general type known as an HDL synthesizer.

The following is a more detailed explanation of the graph fusion process in accordance with a present embodiment of the invention. Graph fusion includes two basic processes. The first is the arc product process. The second is the DFG (data flow graph) product process. It will be appreciated that individually, these processes are well known data flow analysis techniques used in Compiler development. For example, see Compilers: Principles, Techniques and Tools, referenced above for instance.

The arc product process is as follows. Given two sets of arcs $E_1=\{c_{1i}:e_{1i}|i\in[1, n]\}$, $E_2=\{c_{2j}:e_{2j}|i\in[1, m]\}$, their arc product is denoted by $E_1 \times E_2$, which is the set $\{(c_{1i}{}^* c_{2j}): e'_{2j}|i \in[1,n], j\in[1, m], e'_{2j}$ is a duplicated arc for $e_{2j}\}$. $(c_{1i}{}^* c_{2j})$ is a label for arc $e'_{2j}$—$e'_{2j}$ is a duplication arc for $e_{2j}$ meaning that both arcs have the same starting vertex and ending vertex.

The data flow graph process is as follows. Given an arc $e=(v_1,v_2)$ connecting two DFG nodes, it can be merged into one DFG vertex v' by performing dataflow graph construction. That is, if both vertices write to the same variable, then $v_2$ will have higher priority. If $v_1$ writes to a variable and $v_2$ reads it, then the value $v_2$ reads will come from the value $v_1$ writes. If $v_1$ reads a variable and $v_2$ writes it, then the copy $v_1$ reads will be different from the one being written by $v_2$. If both vertices write to a variable, the value written by $v_1$ can be discarded.

A fused graph can be produced from an original graph (or subgraph) according to the following process.

1. Given an acyclic graph $G=(V_d+V_c, E)$ with source and sink vertices.
2. Choose a subgraph $G'=(V'_d+V'_c, E')$ containing the vertices for only one control construct and all the arcs/vertices between the vertex pair. In the present embodiment, a control construct includes a pair of vertices, a branch vertex and a join vertex.
3. Find the arc(s) incident to the entry of G'.
3.1 Let $\{e\}$ denote the set of arcs incident to G', replace $\{e\}$ with the arc product $\{e\} \times E'$.
4. For each arc in E', perform a DFG product process if applicable.
5. Repeat steps 24 until G cannot be changed anymore.

Figure 4A:
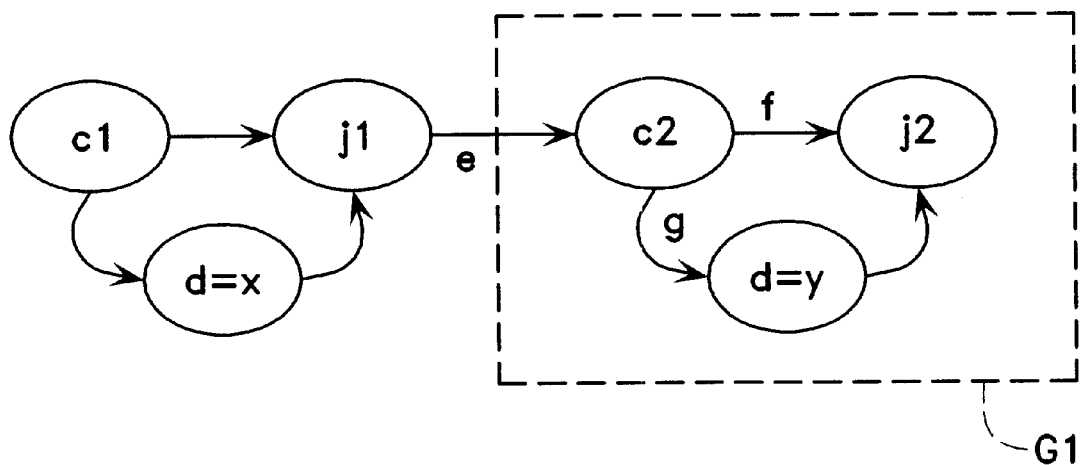

Referring to the illustrative drawings of FIGS. 4A–4G, there is shown an example of the graph fusion process applied to the graph of FIG. 1. In FIG. 4A, a first subgraph G1 (shown within dashed lines) is selected which includes a selected first control construct. The selected first control construct includes control branch vertex c2 and corresponding control join vertex j2. The selected first subgraph also includes all arcs and data vertices encompassed by the selected first control construct. In this example, there is an arc originating at c2, and there is an arc originating at data vertex d=y and terminating at j2.

The arc incident upon the entry of c2 is identified and is labeled e in FIG. 4A. The arcs branching from c2 are identified and are labeled f and g in FIG. 4A. The arc product of e with the set of arcs f and g, e×{f, g} is determined.

Figure 4B:
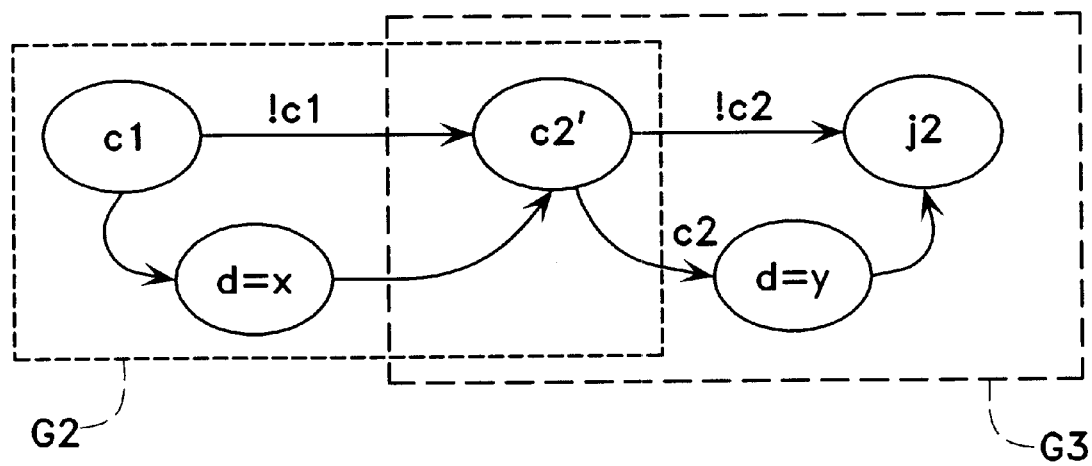

Referring to FIG. 4B, there is shown an intermediate fused graph that represents the fusion of e and graph G1 in FIG. 4A. The product arcs E1 and E2 replace the arcs labeled f and g in FIG. 4A. The control vertex c2 and the join vertex j2 are replaced by an intermediate vertex labeled c2'.

The process of transforming the graph of FIG. 4A into the graph of FIG. 4B can be explained as follows. First for consistency with the above explanation of graph fusion, denote the edges of G1 to be E, we first form the product of (e) and E:

(e): {e:<true>: j1→c2}
E: {f:<f>:c2→j2,
   q:<q>:c2→d=y
   :<true>:d=y→j2}

Note that e:<true>:j1→c2 represents an arc labelled as e, and it is labelled as <true>. Therefore, f:<f>:c2→j2 represents an arc from c2 to j2, and it is labelled as f. The arc is taken when <f> is true.

{e}xE: {f:<f>:c2→j2,
   q:<q>:c2→d=y,
   :<true>:d=y→j2}

By replacing $\{e\}$ with $\{e\}xE$, FIG. 4A is directly transformed into FIG. 4B.

The intermediate vertex c2' has arcs !c2 and c2 originating from it. It will be appreciated that these two values may represent two possible logical states (such as binary "0" and binary "1" or such as "true" and "false") associated with the two different branches. Arc !c2 terminates at j2. The arcs originating from c2' in FIG. 4B correspond directly to the arcs originating from c2 in FIG. 4A. Arc c2 terminates at vertex d=y. An arc also originates at vertex d=y and terminates at vertex j2.

The vertex c1 has arcs !c1 and c2 originating from it. Arc !c terminates at vertex c2'. Arc c2 terminates at vertex d=x. An arc also originates at vertex d=x and terminates at intermediate vertex c2'.

The graph in FIG. 4B can be viewed as two subgraphs G2 and G3, each shown in dashed lines. Subgraph G2 includes vertices c1, d=x and c2'. Subgraph G3 includes vertices C2', d=y and j2.

FIGS. 4C1–4C4 pictorially represent the combination of possible different complete execution flows for the graph of FIG. 3. Thus, each of FIGS. 4C1–4C4 illustrates a different possible complete path indicated by heavier arc lines. The illustrated process flows of FIGS. 4C1–4C4 identify all possible complete flow paths through the intermediate graph of FIG. 4B. Each possible combination of a respective arc originating from vertex c1 with an arc originating from vertex c2' is identified. In this example, respective possible complete paths include the respective combinations of arcs: (!c1, !c2), (!c1, c2), (c1, !c2) and (c1, c2). More specifically, in this example, FIG. 4C1 illustrates a possible complete path from c1 to j2 that includes the arc combination (!c1, !c2). That complete path follows arc !c1 and arc !c2 without proceeding through any data vertex. FIG. 4C2 illustrates a possible complete path from c1 to j2 that includes the arc combination (!c1, c2). That complete path follows arc !c1 and arc c2 through any data vertex d=y. FIG. 4C3 illustrates a possible complete path from c1 to j2 that includes the arc combination (c1, !c2). That complete path follows arc c1 and arc !c2 through data vertex d=x. FIG. 4C4 illustrates a possible complete path from c1 to j2 that includes the arc combination (c1, c2). That complete path follows arc c1 and arc c2 through data vertex d=x and through data vertex d=y.

Figure 4D:
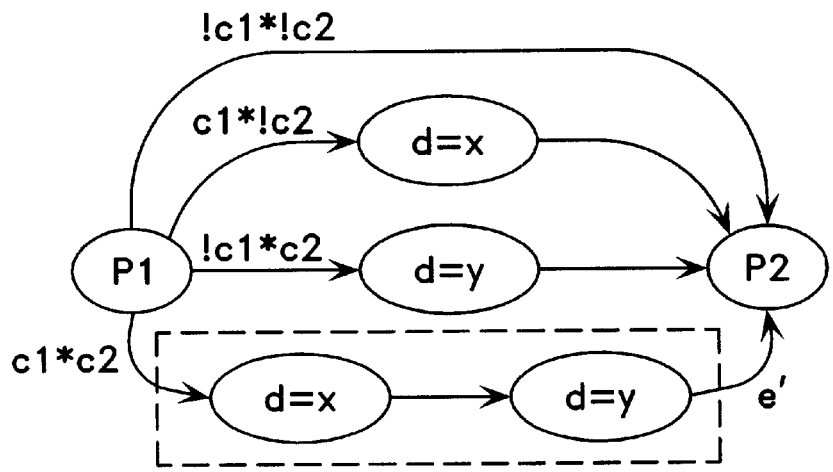

Referring to FIG. 4D, there is shown another fused graph representing the fusion of graphs G2 and G3 in FIG. 4B. More specifically, the graph of FIG. 4D is the result of fusing G3 with the edges in G1, d=x→c2',c1→d=x.

The fused graph of FIG. 4D illustrates all possible complete paths associated with all possible concatenations of the branch control arcs of FIG. 1. The graph of FIG. 4D, therefore, represents an information structure in a computer readable medium in which (branch and join) control structures have been replaced by every possible complete path through the graph structure that is made possible by such control structures. Each respective complete path in the structure is associated with the respective control statements of branches that were concatenated to produce the respective complete path. Thus, in essence, the graph of FIG. 4B is unrolled into multiple complete paths in FIG. 4D.

In FIG. 4D, the complete paths originate from a path origination node P1 and are provided to a path destination node P2. These paths are labelled according to the branches concatenated to produce the paths: (!c1, !c2), (!c1, c2), (c1, !c2) and (c1, c2). The complete path that includes control branch combination (!c1, !c2) includes an arc labeled !c1*!c2 that originates at P1 and terminates at P2 since it does not include a data vertex (control statement association). The symbol, *, represents the logical "AND" operation. The complete path that includes the control branch combination (!c1, c2) includes an arc labeled !c1*c2 that originates at P1 and terminates at data vertex d=y (a control statement association) and includes an arc that originates at that data vertex and that terminates at P2. The complete path that includes the control branch combination (c1, !c2) includes an arc labeled c1*!c2 that originates at P1 and terminates at data vertex d=x (a control statement association) and includes an arc that originates at that data vertex and that terminates at P2. The complete path that includes the control branch combination (c1, c2) includes an arc labeled c1*c2 that originates at P1 and terminates at data vertex d=x (a control statement association) and includes an arc that originates at data vertex d=x and that terminates at data vertex d=y and includes an arc that originates at d=y and terminates at P2.

Figure 4E:
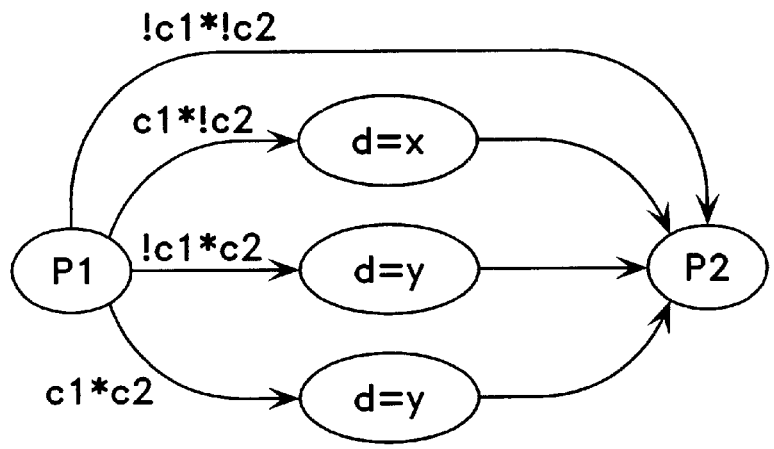

FIG. 4E shows a graph information structure that is the result of another DFG fusion process upon the graph in FIG. 4D. Basically, the data vertex d=x is removed since the d=x operation is overwritten by the d=y operation.

Figure 4F:
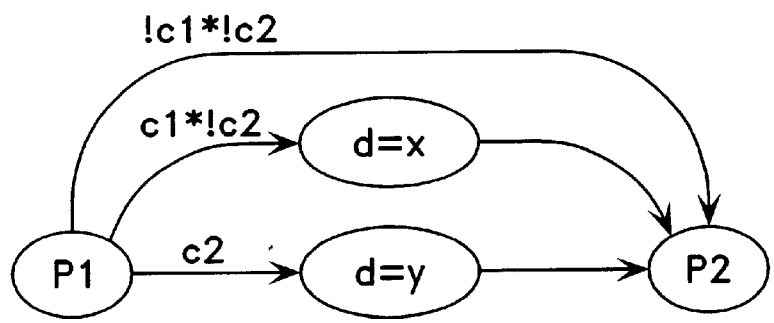

FIG. 4F is a graph information structure that results from a logic optimization upon the graph of FIG. 4E. In essence, since the respective complete paths that include the respective branch control arc combinations labeled !c1*c2 and c1*c2 both terminate at respective data vertices with a data reference d=y, the two arcs in FIG. 4E can be replaced with a single arc labeled c2 in FIG. 4F.

Fused Graph Traversal

Once a graph information structure has been formed that comprises only complete paths and associated control statements, graph traversal along all paths through information structure is performed to identify the possibility of conditions under which a variable is not referenced (read/written). In a present embodiment, a graph traversal is a process implemented using computer program code that involves following all paths through the graph and involves identification or actual performance of the data functions directed by the control statements associated with the paths. In this example, the fused graphs of FIGS. 4D–F each have only one path origination vertex P1 and only one path destination vertex P2. The optimizations of FIGS. 4D–F merely simplify the traversal process.

Referring to FIG. 4F, the traversal of the complete path with the combination !c1*!c2 does not involve traversal of a data vertex associated with a control statement. The traversal of the complete path with the combination c1*!c2 involves traversal of the data vertex d=x associated with a control statement that directs the assignment of the value x to the variable d. The traversal of the complete path with the combinations c2 involves traversal of data vertex d=y associated with a control statement that directs the assignment of the value 4 to the variable d.

Based upon the traversal of the fused graph of FIG. 4F, a determination can be made that there exists a complete path through the original graph of FIG. 1 in which no data reference occurs. Thus, it is determined that a variable may traverse the graph of FIG. 1 unchanged. Consequently, in accordance with the present invention, a sequential state element will be extracted for the hardware circuit corresponding to the graph of FIG. 1.

Referring back to FIG. 1, it will be appreciated that values c1 and !c1 represent the two possible logical branches (true and false for instance) that may originate from control vertex c1. Values c2 and !c2 represent the two possible logical branches that may originate from control vertex c2. The combinations c1*c2, c1*!c1, !c1*c2 and !c1*!c2 represent Boolean AND operations.

Figure 5:
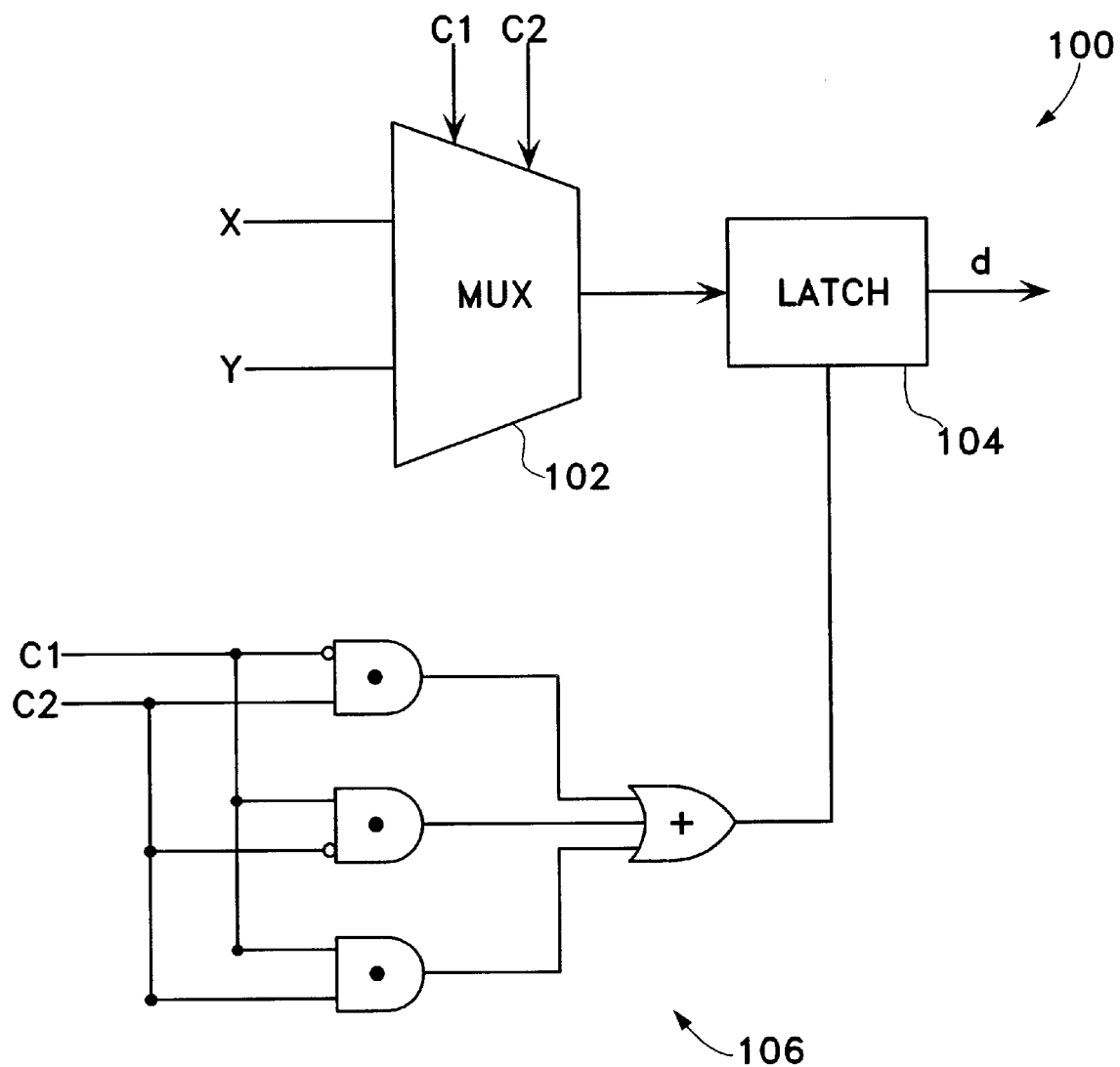
FIG. 5 is a illustrative schematic diagram of a circuit that can be extracted from the graph of FIG. 1 in accordance with the present invention.

The illustrative drawing of FIG. 5 shows an example of a hardware circuit that may be extracted for the graph of FIG. 1. The circuit 100 includes a multiplexer circuit 102 a latch 104 and combinatorial control logic 106 connected as shown.

Additional Examples of Graph Projection and Graph Fusion

The following illustrative examples show the application of graph projection and graph projection in accordance with a presently preferred embodiment of the invention to the extraction of hardware circuit components.

Figure 6A:
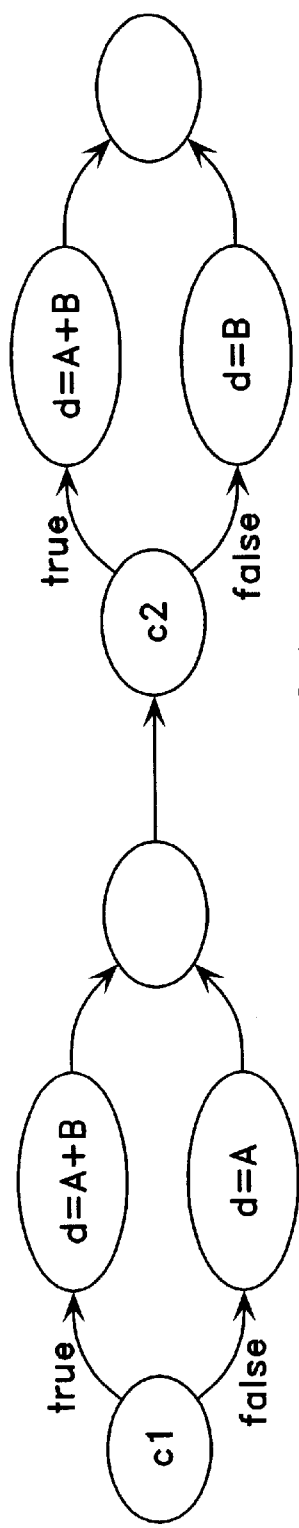
FIG. 6A shows an illustrative graph.
Figure 6C:
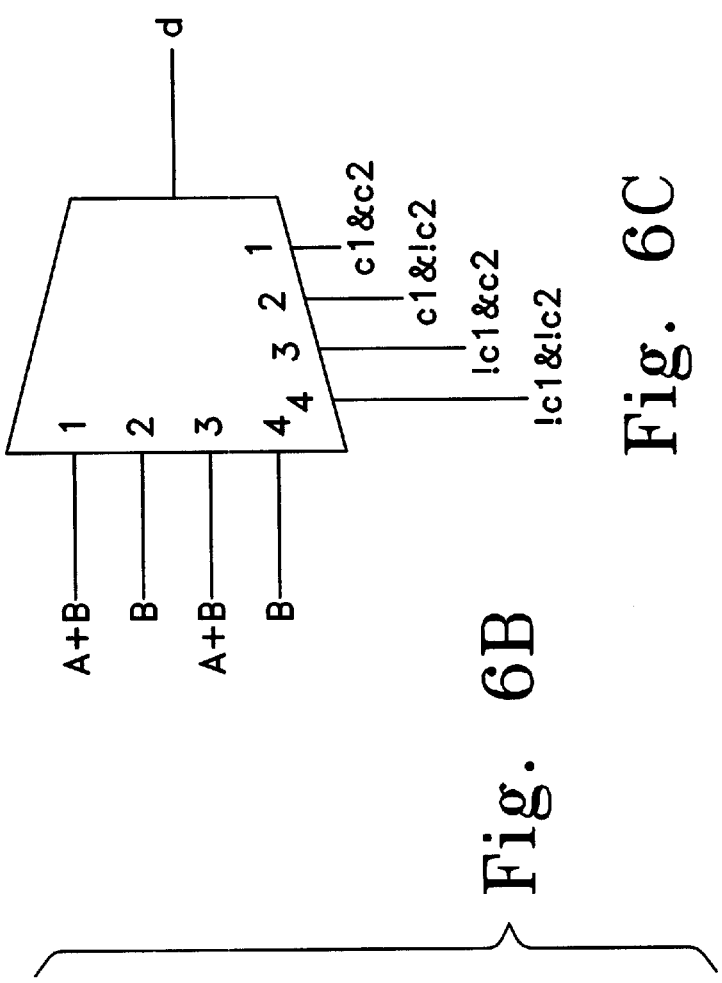
FIG. 6C is an illustrative circuit extracted from the graph of FIG. 6B in accordance with the invention.
Figure 6B:
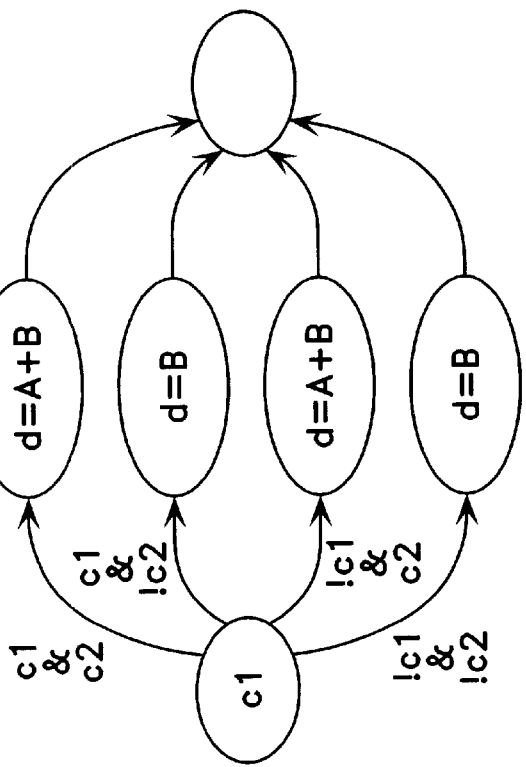
FIG. 6B shows and illustrative fused subgraph produced when projection and fusion process are applied with respect to variable d of the graph of FIG. 6A.

FIG. 6A shows a CDFG with two control constructs. The left control construct has one branch to a control statement d=A+B and has another branch to a control statement d=B. The right control construct receives an arc from the left control construct. The right control construct has one branch to control statement d=A+B and has another branch to control statement d=B. FIG. 6B shows the fused subgraph produced when projection and fusion processes are applied to the graph with respect to variable d. There are four possible complete paths. The respective resultant control statement for each respective complete path is shown associated with each such path. Note that the control statement d=A never survives the traversal of any complete path. Consequently, that statement does not appear in FIG. 6B. FIG. 6C shows a hardware circuit that can be extracted from the fused graph. There is no data storage element in FIG. 6C. since there is no complete path in the graph of FIG. 6B that can be traversed without possibly changing the value of a variable traversing the path.

FIG. 7A shows a CDFG. FIG. 7B shows the fused subgraph produced when projection and fusion processes are applied to the graph with respect to variable c. FIG. 7C shows the fused subgraph produced when projection and fusion processes are applied to the graph with respect to variable d. FIG. 7D shows a hardware circuit that can be extracted from the fused graph of FIG. 7B in accordance with the invention. FIG. 7E shows a hardware circuit that can be extracted from the fused graph of FIG. 7C in accordance with the invention. There is no data storage element in FIGS. 7D or 7E since there is no path in either FIG. 7B or 7C that can be traversed without possibly changing the value of a variable traversing the path.

Figure 8A:
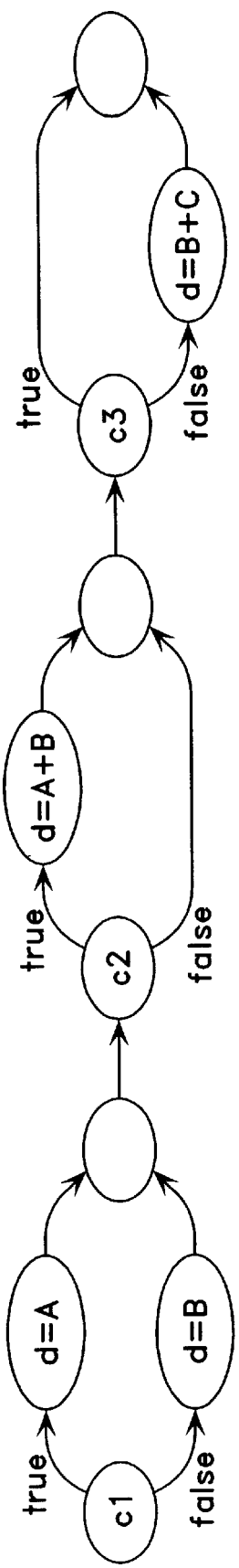
FIG. 8A shows an illustrative graph.
Figure 8B:
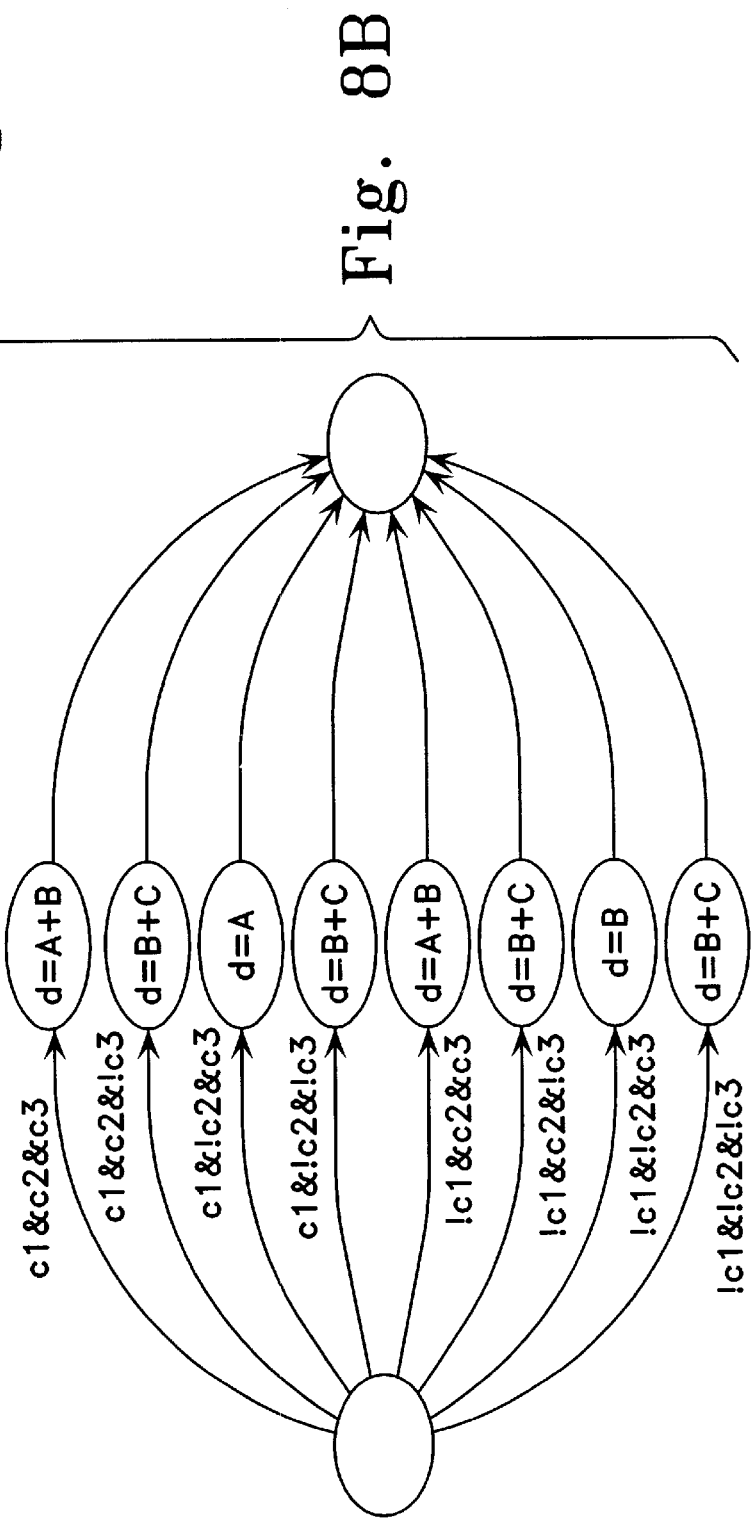
FIG. 8B shows and illustrative fused subgraph produced when projection and fusion process are applied with respect to variable d of the graph of FIG. 8A.
Figure 8C:
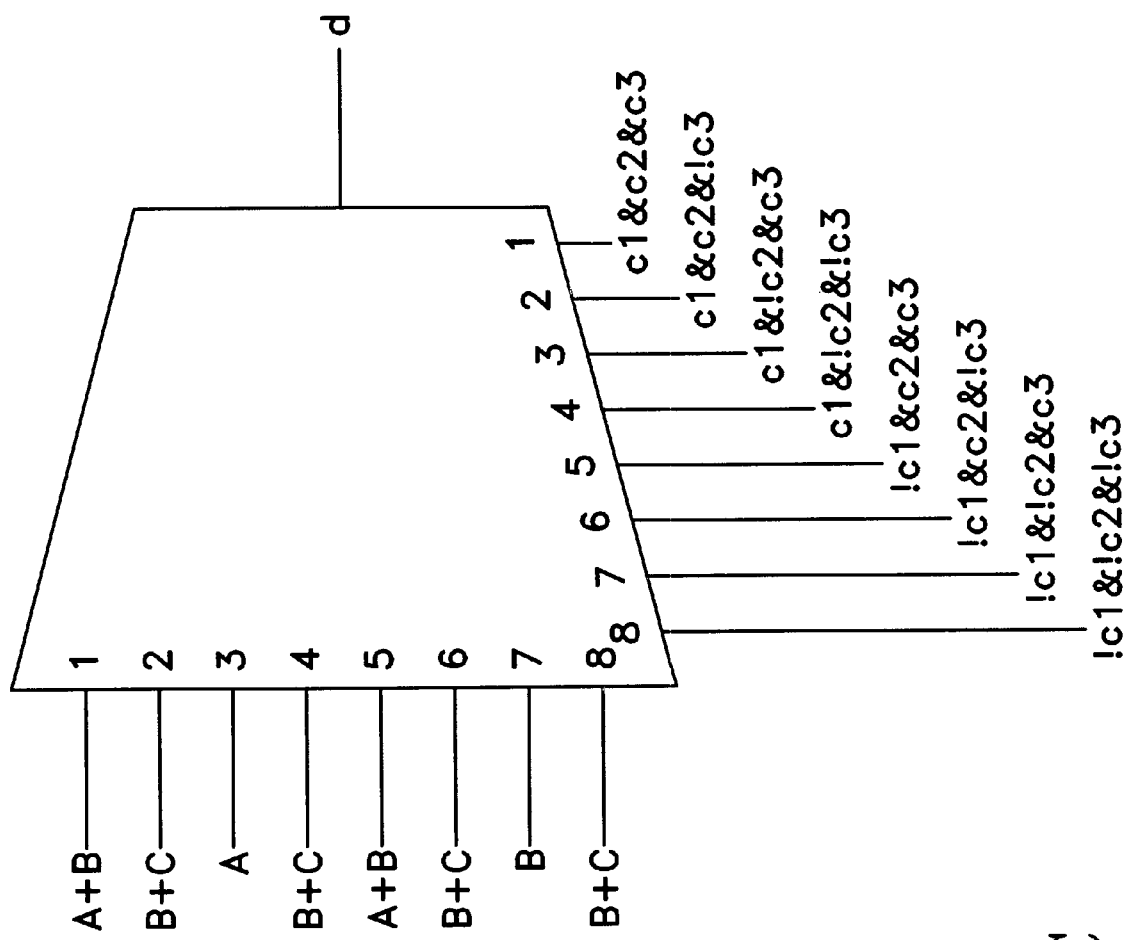
FIG. 8C is an illustrative circuit extracted from the graph of FIG. 8B in accordance with the invention.

FIG. 8A shows a CDFG with three control structures. FIG. 8B shows the fused subgraph produced when projection and fusion processes are applied to the graph with respect to variable d. FIG. 8C shows a hardware circuit that can be extracted from the fused graph.

In extracting the hardware circuits of FIGS. 6C, 7D, 7E and 8C, it is assumed that the corresponding CDFGs are guarded by bi-directional event guards. That means that the CDFGs will be evaluated only when any change to the value of A, B, C, D, c1, c2, or c3.

HDL Program Fragment Examples

The following examples illustrate how different sample HDL program fragments can result in different CDFGs and how the processes of the present invention can evaluate the need for a sequential state element for each sample fragment.

Figure 9A:
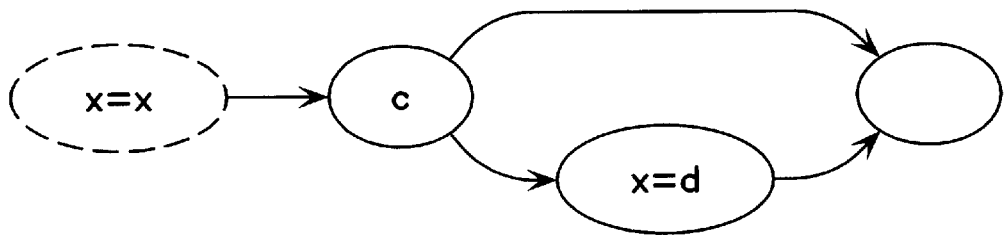
FIG. 9A is an illustrative example of a CDFG produced from a first HDL description.
Figure 9B:
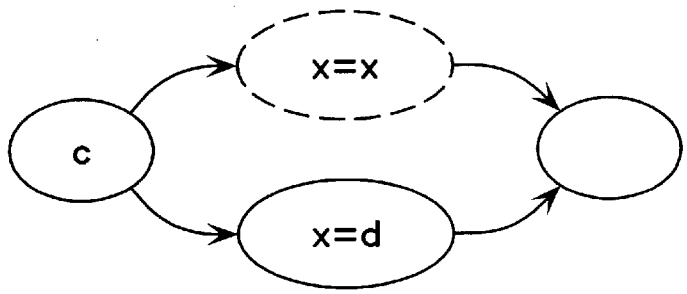
FIG. 9B is a projected and fused graph produced from the graph of FIG. 9A.
Figure 9C:
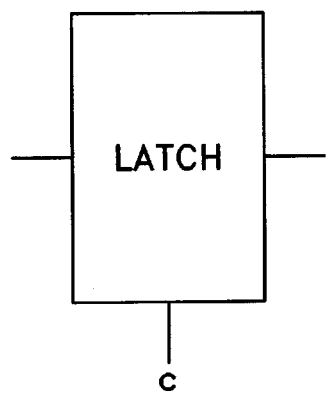
FIG. 9C is an illustrative drawing of a circuit extracted from the graph of FIG. 9B in accordance with the invention.

The first example HDL program fragment is:

if (c)
    x=d;

The first program fragment results in the CDFG of FIG. 9A. A faked assignment, for example, is made with respect to variable x. The faked assignment is: x=x. In connection with graph traversal portion of the process an assignment x=x is inserted in front of the entry point to the CDFG. Such faked assignment is used to indicate whether a variable value can change during execution flow through a CDFG. If the variable value can change, then a latch should be extracted. The faked x=x assignment, is indicated by dashed lines in FIG. 9A, and is applied to vertex c. The graph projection and fusion processes applied to the graph of FIG. 9A result in the graph of FIG. 9B which is used to determine whether the variable x can traverse any path of the graph unchanged. Since it can, a sequential state element is required as illustrated by the latch hardware extraction of FIG. 9C.

Figure 10A:
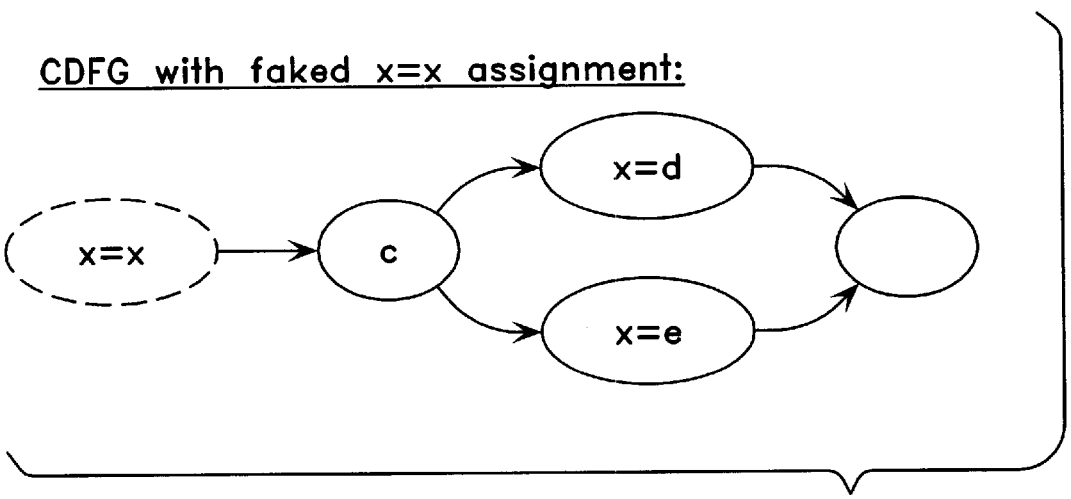
FIG. 10A is an illustrative example of a CDFG produced from a second HDL description.
Figure 10B:
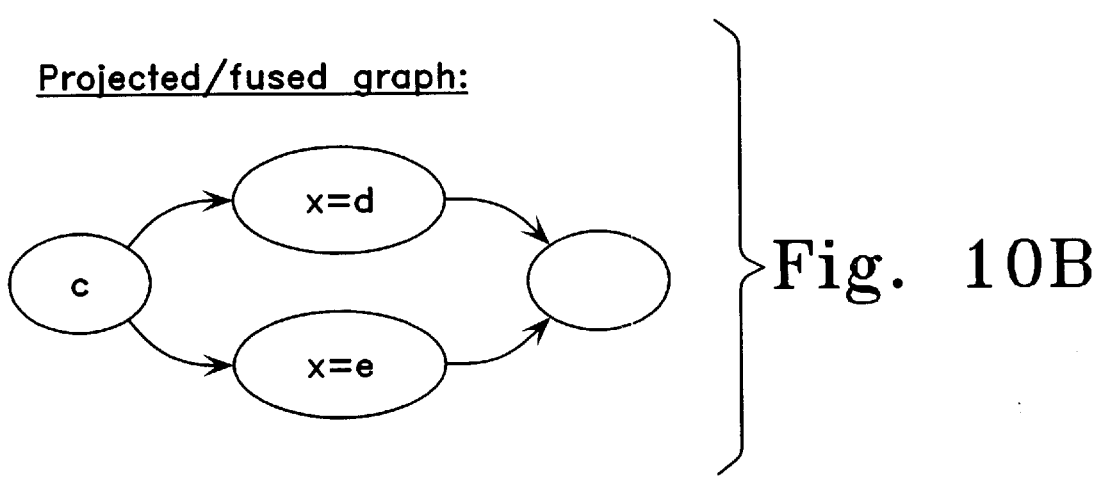
FIG. 10B is a projected and fused graph produced from the graph of FIG. 10A.
Figure 10C:
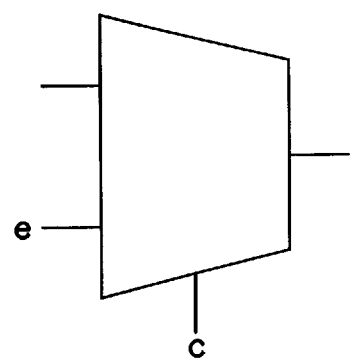
FIG. 10C is an illustrative drawing of a circuit extracted from the graph of FIG. 10B in accordance with the invention.

The second example HDL program fragment is:

if (c)
　x=d;
if (!c)
　x=e;

The second program fragment results in the CDFG of FIG. 10A. A faked x=x assignment, indicated by dashed lines in FIG. 10A, is applied to vertex c. The graph projection and fusion processes applied to the graph of FIG. 10A result in the graph of FIG. 10B which is used to determine whether the variable x can traverse any path of the graph unchanged. The variable x cannot traverse the graph of FIG. 10B unchanged since the control statement x=x is not associated with any path of FIG. 10B. Thus, no sequential state element is required as illustrated by the multiplexer hardware extraction of FIG. 10C.

Figure 11A:
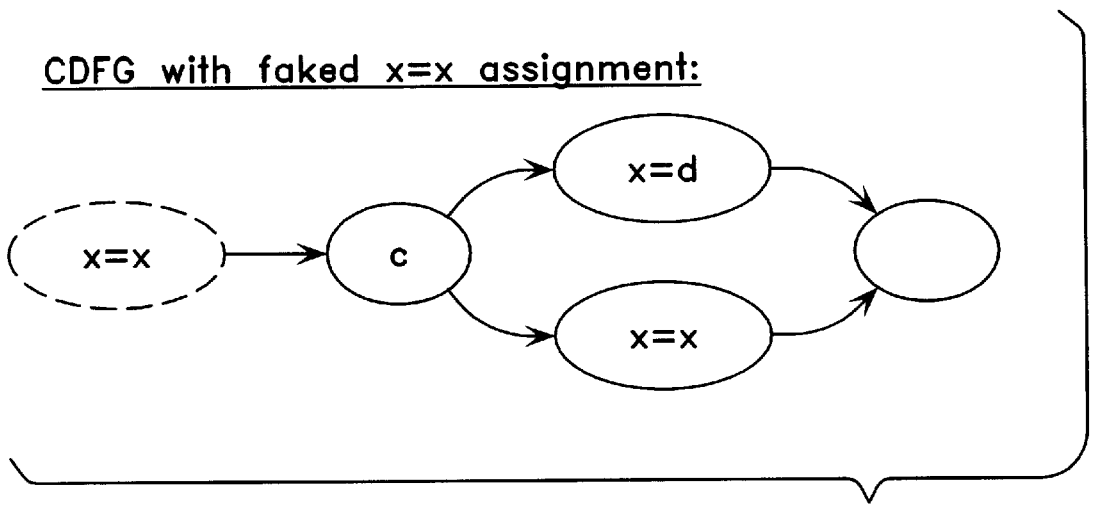
FIG. 11A is an illustrative example of a CDFG produced from a third HDL description.
Figure 11B:
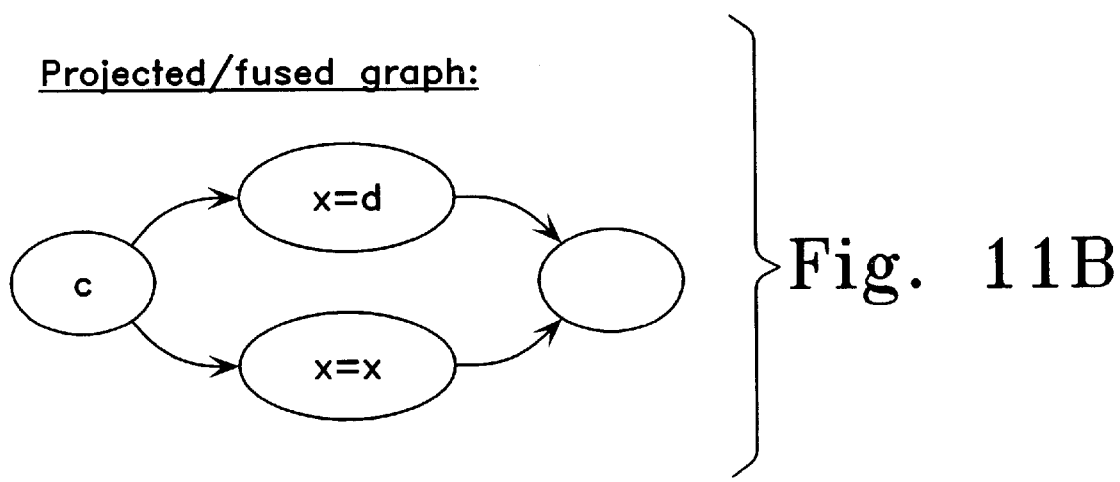
FIG. 11B is a projected and fused graph produced from the graph of FIG. 11A.
Figure 11C:
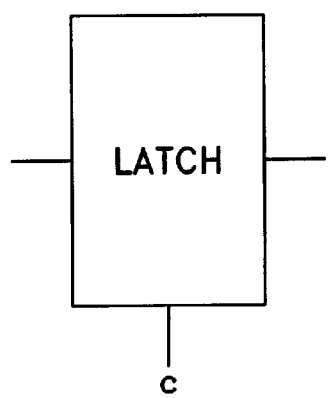
FIG. 11C is an illustrative drawing of a circuit extracted from the graph of FIG. 11B in accordance with the invention.

The third example HDL program fragment is:

if (c)
　x=d:
else
　x=x;

The third program fragment results in the CDFG of FIG. 11A. A faked x=x assignment, indicated by dashed lines in FIG. 11A, is applied to vertex c. The graph projection and fusion processes operate to produce the graph in FIG. 11B which is used to determine whether the variable x can traverse any path of the graph unchanged. Since variable x could traverse the path associated with the control statement x=x unchanged, a sequential state element is required as illustrated by the latch hardware extraction of FIG. 11C.

The fourth through seventh examples involve HDL descriptions that call for an asynchronous control element. A storage element is required for asynchronous control. Thus, there is no need to engage in graph traversal to discern the need for a storage element. Nevertheless, the method and apparatus of the present invention still is advantageous since it supports a wider range of "styles" of HDL descriptions.

More specifically, the present invention results in allocation of a latch (storage elements which are "transparent" when clock pin is high) /flip-flop (storage elements which lock inputs only when the specific edge of a clock occurs)/combinational-logic for an HDL description. Graph projection and fusion are followed by circuit hardware extraction. Depending on the type of guard, the types of hardware that will be allocated will be different.

1. @(a or b or c . . . )—The allocated hardware will be latches or combinational logic, depending on if the "fake assignment" survives the graph operations. See FIGS. 1–10.

2. @(posedge a or negedge b or . . . )—The allocated hardware will ALWAYS be flip-flops no matter if how the fake assignments survives the graph operations or not. In this case, all signals that show up in the guard list are treated as synchronization signals. That is, whenever a specific change to the signal occurs, it can cause the change of the data variables in the process. Among these synchronization signals, the one with the lowest priority will be picked up as the clock signal while the rest will be mapped into asynchronous set, asynchronous reset, or asynchronous load signals. See FIGS. 11–16.

Figure 12A:
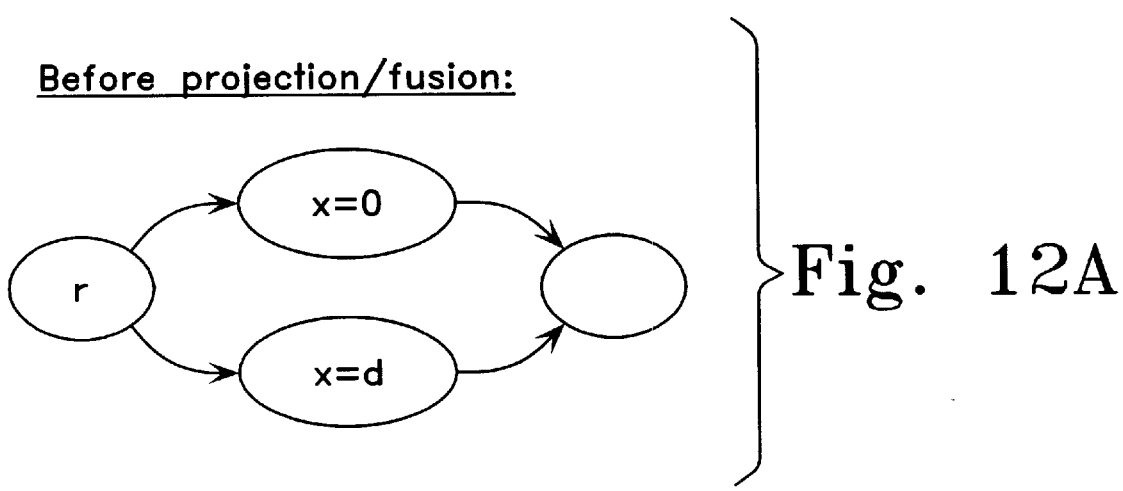
FIG. 12A is an illustrative example of a CDFG produced from a fourth HDL description.
Figure 12B:
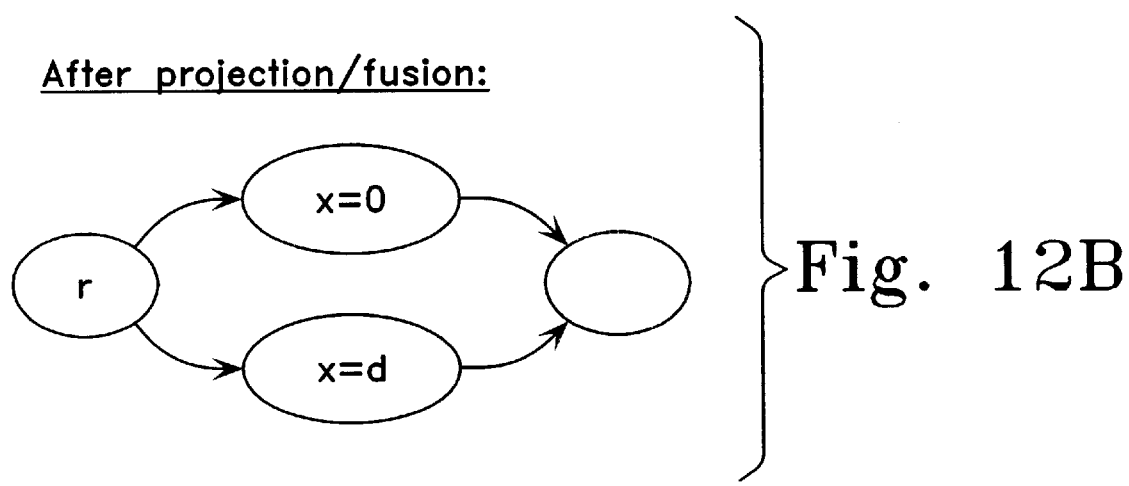
FIG. 12B is a projected and fused graph produced from the graph of FIG. 12A.
Figure 12C:
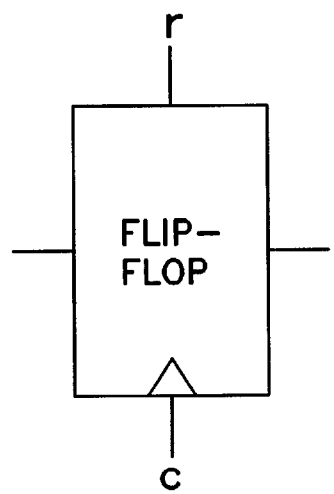
FIG. 12C is an illustrative drawing of a circuit extracted from the graph of FIG. 12B in accordance with the invention.

The fourth example HDL program fragment is:

@(↑c or ↑r)
if (r)
　x=0;
else
　x=d;

In this fourth program fragment, r is identified as an asynchronous control pin since it appears in the guard and is used as the controlling variable in the if-then-else statement. A guard (or event guard) is a HDL construct ('@' in Verilog, 'process' or 'wait' in VHDL) which halt the execution of a block of statement. When the flow of execution runs into such a construction, the execution of flow immediately stops. The simulation cannot progress until, whenever the condition of the guard argument is met, the statement following the guard can then resume execution. The guard r is recognized as an asynchronous reset when r is active (high) x is 0. The graph for this program fragment is shown in FIG. 12A. The graph is the same before and after fusion as illustrated in FIG. 12B. The corresponding hardware extraction is the flip-flop with asynchronous reset pin r shown in FIG. 12C.

Figure 13A:
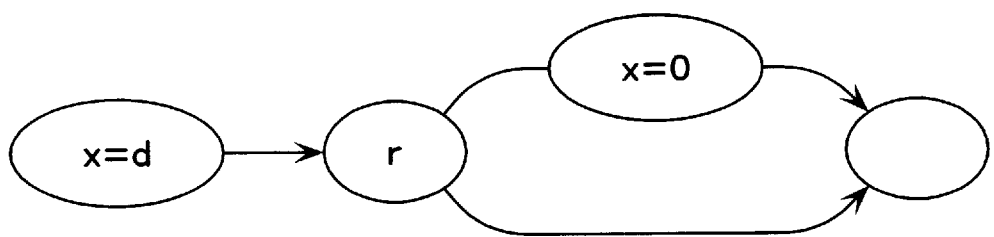
FIG. 13A is an illustrative example of a CDFG produced from a fifth HDL description.
Figure 13B:
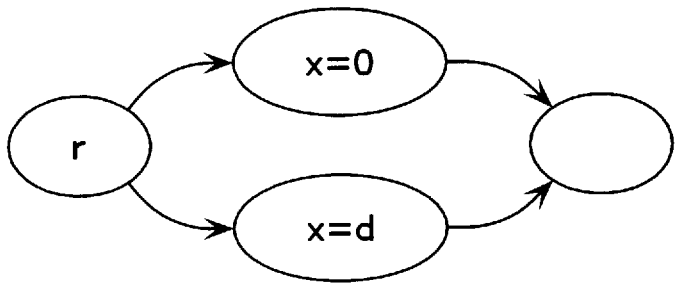
FIG. 13B is a projected and fused graph produced from the graph of FIG. 13A.
Figure 13C:
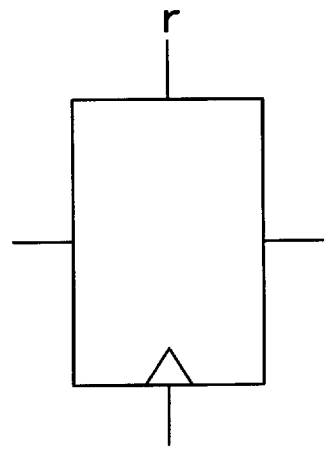
FIG. 13C is an illustrative drawing of a circuit extracted from the graph of FIG. 13B in accordance with the invention.

The fifth example HDL program fragment is:

@(↑c or ↑r)
　x=d;
if (r)
　x=0;

Once again, r is identified as an asynchronous control pin since it appears in the guard and is used as the controlling variable in the if statement. It is recognized as an asynchronous reset when r is active (high) x is 0. The graph for this program fragment before projection and fusion processes is shown in FIG. 13A. The graph after projection and fusion processes is shown in FIG. 13B. The hardware extraction is the flip-flop with asynchronous reset pin r shown in FIG. 13C.

The sixth and seventh HDL program fragments which follow illustrate that the techniques of the present invention can be employed to extract the same hardware circuit from different HDL statement styles that are used to describe the same hardware circuit behavior.

The sixth and seventh HDL program fragments represent the same functional statement written in two different "styles". However, the same hardware circuit is extracted despite the different styles.

The sixth example HDL program fragment is:

@(↑clk or ↑reset or ↑set)
d=q;
if (reset)
　d=0;
if (set)
　d=1;

A CDFG for the sixth example program fragment is set forth in FIG. 14.

The seventh example HDL program fragment is:

@(↑clk or ↑reset or ↑set)

```
if (set)
   d=1;
else if (reset)
   d=0;
else
   d=q;
```

A CDFG for the seventh example program fragment is set forth in FIG. 15.

Figure 16A:
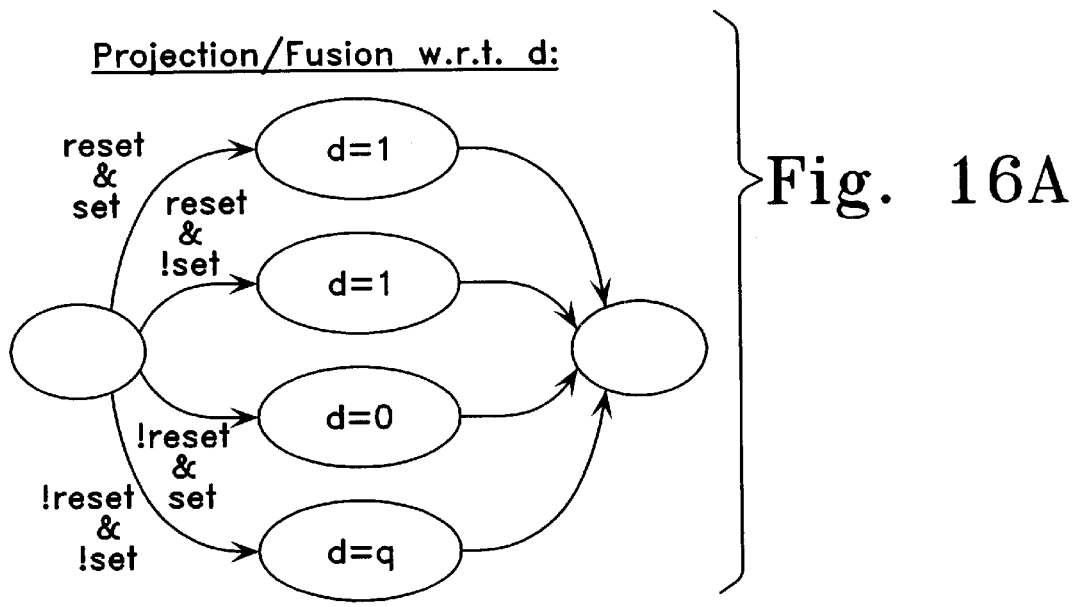
FIG. 16A is an illustrative graph produced though projection and fusion of either the graph of FIG. 14 or FIG. 15 in accordance with the present invention.
Figure 16B:
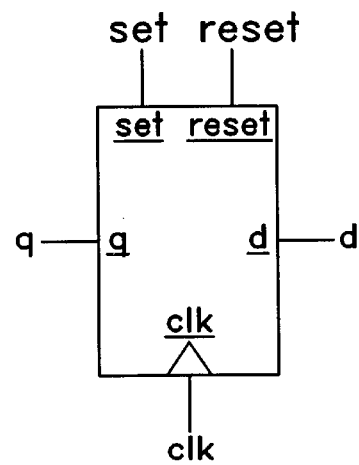
FIG. 16B is an illustrative drawing of a circuit extracted from the graph of FIG. 16A.

Application of the projection, with respect to d, and fusion processes of the present invention to either the CDFG of FIG. 14 or to the CDFG of FIG. 15 results in the fused graph of FIG. 16A. The extracted hardware is illustrated in FIG. 16B. Thus, different HDL description styles result in extraction of the same hardware circuit.

Thus, it will be appreciated that the processes of the present invention are quite versatile in their ability to extract hardware from different HDL program styles. Graph fusion is responsible for morphing HDL designs of various styles into a canonical representation so that can be used to extract latch, flip-flop or combinational logic circuits.

Alternative Embodiment

Referring to the CDFG of FIG. 1, an alternative computer code implemented process to evaluate the need for a sequential state element with respect to variable d involves identifying each control construct in the graph. All control branch arcs of the control constructs are identified. Each respective data vertex that is associated with a respective control branch arc is identified. A table shown below is created in a computer readable medium that sets forth an indication of every possible combination of control branch arc in which each combination includes a control branch arc from every identified construct but only one control branch arc for each control construct. The table also associates each combination with an indication of each data vertex identified as being associated with a branch control arc of the combination.

TABLE

| Combinations of Branch Control Arcs | Associated Data Vertices |
|---|---|
| !c1, !c2 | None |
| c1, !c2 | d = x |
| !c1, c2 | d = y |
| c1, c2 | d = x, d = y |

If there is a combination indication in that table that is not associated with any data vertex indication, then there exists a complete path through the original CDFG that a variable could traverse unchanged, and a sequential state element is required. Otherwise, the variable would change as it traversed the original CDFG, and no sequential state element is required.

Example Computer System in which the Invention Can Operate

Figure 17:
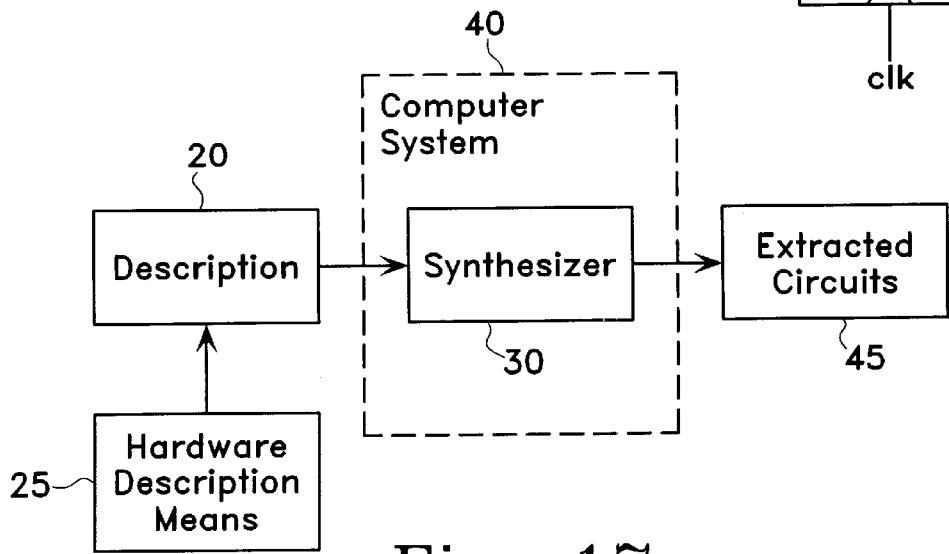
FIG. 17 is an example of a computer system in which the method and apparatus of the present invention can operate.

An apparatus and method of this invention are operable in a computer system that includes a data input device, such as a keyboard, a processing unit, and an output display device. Referring to FIG. 17 there is shown a computer system 40. A user-generation description 20 of the operation of the logic network may be created by a user using hardware description means 25. The description 20 can be an HDL description that specifies how a desired digital hardware operates, i.e., the signals generated by the hardware. Specifically, an HDL description 20 describes values assigned to logic variables and the circumstances under which those values are assigned., i.e, description 20 specifies the signals and the circumstances under which those signals are produced. Specification of any specific logic element, such as a flip-flop, or any connections between logic elements so as to create the desired signals are not required in user description 20. Typically, the user provides description 20 using the computer system data input device.

A hardware description language synthesizer 30, in response to an HDL description 20, extracts a logic network of circuits 35 from the HDL description. Synthesizer 30 is used to program a computer system 40 which includes an output display and computer storage media (not shown). The synthesizer 30 is implemented to employ code and information structures, in accordance with the invention, to extract circuits 35. In other words, the synthesizer comprises a computer program that uses processes in accordance with the present invention. For instance, the synthesizer 30 uses such code, information structures and processes of the present invention in the course of determining the logic elements (latches, flip flops, combinational logic) required and the interconnections of the logic elements based upon the operational characteristics specified in a HDL description 20. The user does not have to include any hardware specific limitations in description 20.

While specific embodiments of the invention have been described and illustrated, it will be appreciated that modification can be made to these embodiments without departing from the spirit of the invention. Thus, the invention is intended to be defined in terms of the following claims.

What is claimed is:

1. A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising:

producing a graph structure in the storage medium by, providing a path origination node in the storage medium;

providing a path destination node in the storage medium;

producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;

associating respective complete paths with a respective control statements associated in the CDFG with corresponding branches that have been concatenated with other corresponding branches to produce such respective complete paths;

traversing respective complete paths of the graph information structure to determine whether there is a respective path that is not associated with a respective control statement; and extracting a sequential state element from the graph information structure if there is a complete path that does not have an associated control statement.

2. A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising:

producing a graph structure in the storage medium by,
   providing a path origination node in the storage medium;
   providing a path destination node in the storage medium;
   producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structures
   associating respective complete paths with a respective control statements associated in the CDFG with corresponding branches that have been concatenated with other corresponding branches to produce such respective complete paths;
   selecting a variable associated with the CDFG;
   identifying portions of the CDFG that are associated with the selected variable;
   wherein producing a graph structure in the storage medium further includes,
      selecting the first and second and third control structures from portions of the CDFG that are identified as associated with the selected variable; and
   wherein producing respective complete paths further includes separately concatenating each branch of a second control structure of the CDFG with each branch of a third control structure of the CDFG such that a different respective complete path is produced for each possible combination of a respective branch from the first control structure and a respective branch from the second control structure and a respective branch from the third control structure.

3. A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising:
   producing a graph structure in the storage medium by,
      providing a path origination node in the storage medium;
      providing a path destination node in the storage medium;
      producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
      associating respective complete paths with a respective control statements associated in the CDFG with corresponding branches that have been concatenated with other corresponding branches to produce such respective complete paths;
      associating a faked assignment of a variable value to the path origination node.

4. A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising:
   producing a graph structure in the storage medium by,
      providing a path origination node in the storage medium;
      providing a path destination node in the storage medium;
      producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
      associating respective complete paths with a respective control statements associated in the CDFG with corresponding branches that have been concatenated with other corresponding branches to produce such respective complete paths;
      associating a faked assignment of a variable value to the path origination node; and
      wherein traversing respective complete paths of the graph information structure to determine whether there is a respective path that is not associated with a respective control statement involves determining whether there is a complete path in which the faked assignment survives such traversal.

5. A method using at least a portion of a control data flow graph (CDFG) which includes multiple control structures in a computer readable storage medium representing at least a portion of a high level design language (HDL) description of an actual or planned logic circuit to evaluate a need for a sequential state element in the portion of the logic circuit comprising:
   selecting a variable associated with the CDFG;
   identifying portions of the CDFG that are associated with the selected variable;
   producing a graph structure in the storage medium by,
      providing a path origination node in the storage medium;
      providing a path destination node in the storage medium;
      selecting the first and second control structures from portions of the CDFG that are identified as associated with the selected variable;
      producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
      associating respective complete paths with a respective control statements associated in the CDFG with corresponding branches that have been concatenated with other corresponding branches to produce such respective complete paths;
      traversing respective complete paths of the graph information structure to determine whether there is a respective path that is not associated with a respective control statement; and extracting a sequential state element from the graph information structure if there is a complete path that does not have an associated control statement.

6. A computer readable medium including programmed instructions for using at least a portion of a control data flow graph (CDFG) which includes multiple control structures representing at least a portion of a high level design language (HDL) description of an actual or planned logic circuit to evaluate a need for a sequential state element in the portion of the logic circuit, the programmed instructions comprising:

a computer code for producing a graph structure in the storage medium by,
providing a path origination node in the storage medium;
providing a path destination node in the storage medium;
producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
a computer code for associating respective complete paths with a respective control statements associated in the CDFG with corresponding branches that have been concatenated with other corresponding branches to produce such respective complete paths; and
a computer code for traversing respective complete paths of the graph information structure to determine whether there is a respective path that is not associated with a respective control statement;
wherein the computer code for producing a graph structure in the storage medium also,
separately concatenates each branch of a second control structure of the CDFG with each branch of a third control structure of the CDFG such that a different respective complete path is produced for each possible combination of a respective branch from the first control structure and a respective branch from the second control structure and a respective branch from the third control structure.

7. A computer readable medium including programmed instructions for using at least a portion of a control data flow graph (CDFG) which includes multiple control structures representing at least a portion of a high level design language (HDL) description of an actual or planned logic circuit to evaluate a need for a sequential state element in the portion of the logic circuit, the programmed instructions comprising:

a computer code for producing a graph structure in the storage medium by,
providing a path origination node in the storage medium;
providing a path destination node in the storage medium;
producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
a computer code for associating respective complete paths with a respective control statements associated in the CDFG with corresponding branches that have been concatenated with other corresponding branches to produce such respective complete paths; and
a computer code for traversing respective complete paths of the graph information structure to determine whether there is a respective path that is not associated with a respective control statement; and
computer code for extracting a sequential state element from the graph information structure if there is a complete path that does not have an associated control statement.

8. A computer readable medium including programmed instructions for using at least a portion of a control data flow graph (CDFG) which includes multiple control structures representing at least a portion of a high level design language (HDL) description of an actual or planned logic circuit to evaluate a need for a sequential state element in the portion of the logic circuit, the programmed instructions comprising:

a computer code for producing a graph structure in the storage medium by,
providing a path origination node in the storage medium;
providing a path destination node in the storage medium;
producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;
a computer code for associating respective complete paths with a respective control statements associated in the CDFG with corresponding branches that have been concatenated with other corresponding branches to produce such respective complete paths; and
a computer code for traversing respective complete paths of the graph information structure to determine whether there is a respective path that is not associated with a respective control statement; and
computer code for associating a faked assignment of a variable value to the path origination node;
wherein the computer code for traversing respective complete paths of the graph information structure to determine whether there is a respective path that is not associated with a respective control statement involves determines whether there is a complete path in which the faked assignment survives such traversal.

9. A method of producing a canonical information structure in a computer readable medium from a control data flow graph structure (CDFG) in such medium that includes multiple control structures and that represents control and data flow specified by an HDL description:

producing a graph structure in the storage medium by,
providing a path origination node in the storage medium;
providing a path destination node in the storage medium;

producing respective complete paths between the path origination node and the path destination node by separately concatenating each branch of a first control structure of the CDFG with each branch of a second control structure of the CDFG such that a different respective complete path is produced for each possible combination of a respective branch from the first control structure and a respective branch from the second control structure;

associating respective complete paths with a respective control statements associated in the CDFG with corresponding branches that have been concatenated with other corresponding branches to produce such respective complete paths; and wherein producing respective complete paths further includes separately concatenating each branch of a second control structure of the CDFG with each branch of a third control structure of the CDFG such that a different respective complete path is produced for each possible combination of a respective branch from the first control structure and a respective branch from the second control structure and a respective branch from the third control structure.

* * * * *